United States Patent
Lee et al.

(10) Patent No.: US 11,362,002 B2
(45) Date of Patent: Jun. 14, 2022

(54) ADJUSTING WORK FUNCTION THROUGH ADJUSTING DEPOSITION TEMPERATURE

(71) Applicant: Taiwan Semiconductor Manufacturing Co., Ltd., Hsinchu (TW)

(72) Inventors: Hsin-Yi Lee, Hsinchu (TW); Ji-Cheng Chen, Hsinchu (TW); Cheng-Lung Hung, Hsinchu (TW); Weng Chang, Hsinchu (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/870,485

(22) Filed: May 8, 2020

(65) Prior Publication Data

US 2021/0233817 A1 Jul. 29, 2021

Related U.S. Application Data

(60) Provisional application No. 62/966,765, filed on Jan. 28, 2020.

(51) Int. Cl.
*H01L 29/66* (2006.01)
*H01L 21/8234* (2006.01)
(Continued)

(52) U.S. Cl.
CPC ........ *H01L 21/82345* (2013.01); *C23C 16/34* (2013.01); *C23C 16/45553* (2013.01); *H01L 21/28088* (2013.01); *H01L 21/28518* (2013.01); *H01L 21/764* (2013.01); *H01L 21/823418* (2013.01); *H01L 21/823431* (2013.01);
(Continued)

(58) Field of Classification Search
None
See application file for complete search history.

(56) References Cited

U.S. PATENT DOCUMENTS

| | | | |
|---|---|---|---|
| 9,978,601 B2 * | 5/2018 | Tsai | H01L 21/28105 |
| 2009/0230479 A1 * | 9/2009 | Hsu | H01L 21/823842 257/369 |

(Continued)

OTHER PUBLICATIONS

Lang, N. D., et al., "Theory of Metal Surfaces: Charge Density and Surface Energy," Physical Review B., vol. 1, No. 12, Jun. 15, 1970, pp. 4555-4568.

*Primary Examiner* — Joseph C. Nicely
*Assistant Examiner* — Lamont B Koo
(74) *Attorney, Agent, or Firm* — Slater Matsil LLP

(57) ABSTRACT

A method includes forming isolation regions extending into a semiconductor substrate, and recessing the isolation regions. After the recessing, a portion of a semiconductor material between the isolation region protrudes higher than top surfaces of the isolation regions to form a semiconductor fin. The method further includes forming a gate stack, which includes forming a gate dielectric on sidewalls and a top surface of the semiconductor fin, and depositing a titanium nitride layer over the gate dielectric as a work-function layer. The titanium nitride layer is deposited at a temperature in a range between about 300° C. and about 400° C. A source region and a drain region are formed on opposing sides of the gate stack.

20 Claims, 27 Drawing Sheets

(51) Int. Cl.
*H01L 29/417* (2006.01)
*C23C 16/455* (2006.01)
*H01L 21/285* (2006.01)
*H01L 21/28* (2006.01)
*H01L 21/764* (2006.01)
*H01L 27/088* (2006.01)
*H01L 29/08* (2006.01)
*H01L 29/06* (2006.01)
*H01L 29/49* (2006.01)
*H01L 29/45* (2006.01)
*C23C 16/34* (2006.01)

(52) U.S. Cl.
CPC ........... *H01L 21/823475* (2013.01); *H01L 21/823481* (2013.01); *H01L 27/0886* (2013.01); *H01L 29/0653* (2013.01); *H01L 29/0847* (2013.01); *H01L 29/41791* (2013.01); *H01L 29/45* (2013.01); *H01L 29/4966* (2013.01); *H01L 29/66545* (2013.01)

(56) References Cited

U.S. PATENT DOCUMENTS

2011/0298062 A1* 12/2011 Ganguli ............ H01L 21/28088
257/410
2017/0250117 A1* 8/2017 Kannan ............... H01L 29/4966
2018/0175201 A1* 6/2018 Wang ............... H01L 29/66795

* cited by examiner

ADJUSTING WORK FUNCTION THROUGH ADJUSTING DEPOSITION TEMPERATURE

PRIORITY CLAIM AND CROSS-REFERENCE

This application claims the benefit of the U.S. Provisional Application No. 62/966,765, filed on Jan. 28, 2020, and entitled "Deposition Method to Improve P-work Function," which application is hereby incorporated herein by reference.

BACKGROUND

Metal-Oxide-Semiconductor (MOS) devices typically include metal gates, which are formed to solve poly-depletion effect in conventional polysilicon gates. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be generated at the surface of the semiconductor. Adjusting work function through adjusting deposition temperature Metal gates may include a plurality of layers, so that the different requirements of NMOS devices and PMOS devices can be met. The formation of the metal gates typically involves removing dummy gate stacks to form trenches, depositing a plurality of metal layers extending into the trenches, forming metal regions to fill the remaining portions of the trenches, and then performing a Chemical Mechanical Polish (CMP) process to remove excess portions of the metal layers. The remaining portions of the metal layers and metal regions form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
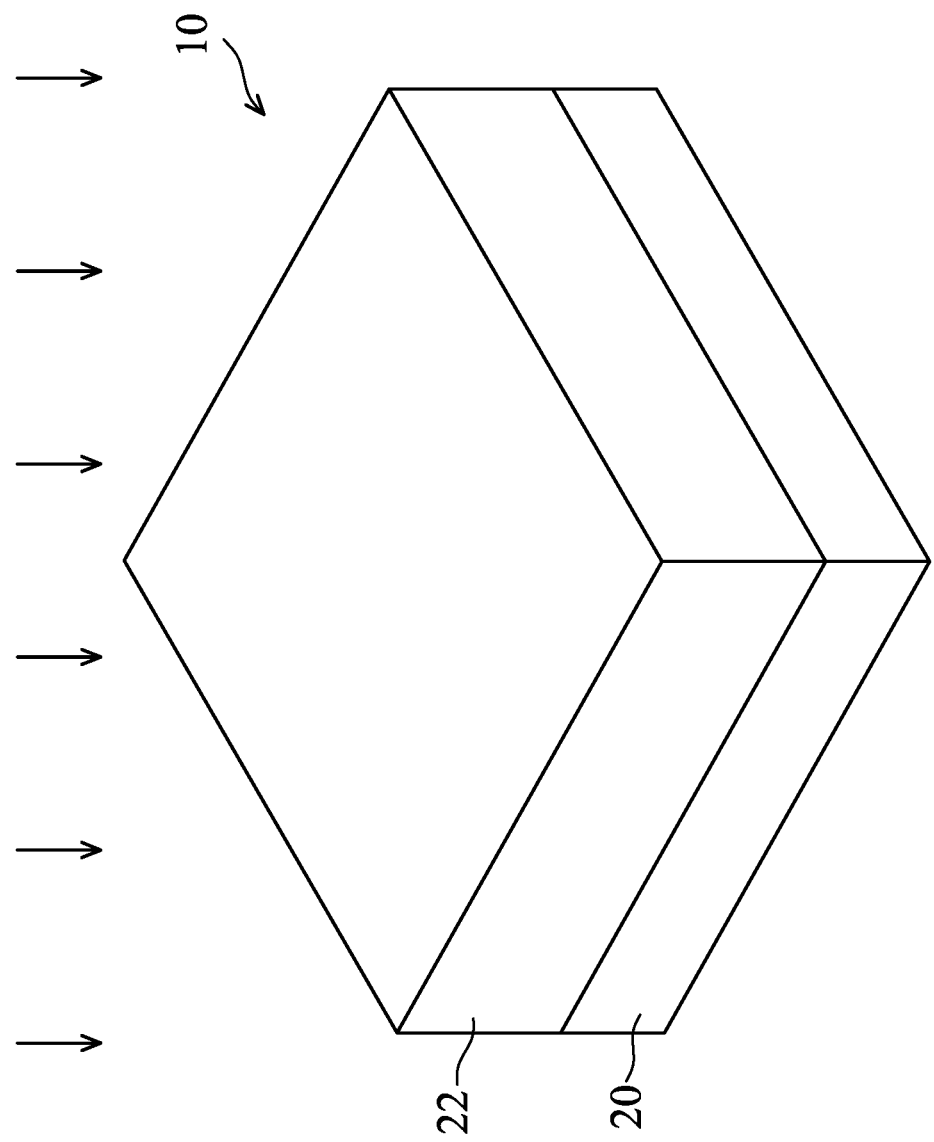
FIGS. 1-6, 7A, 7B, 8A, 8B, 9-20, 21A, and 21B illustrate the perspective views and cross-sectional views of intermediate stages in the formation of Fin Field-Effect Transistors (FinFETs) in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The methods of tuning work functions of the metal gates in transistors are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. In accordance with some embodiments, the formation of Fin Field-Effect Transistors (FinFETs) is used as an example to explain the concept of the present disclosure. Other types of transistors such as planar transistors, nano-sheet transistors, nano-wire transistors, Gate-All-Around (GAA) transistors, or the like, may also be formed by applying the concept of the present disclosure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed as being performed in a particular order, other method embodiments may be performed in any logical order.

In accordance with some embodiments of the present disclosure, to tune the work function of different transistors, different temperatures are used for forming the work-function layers of the transistors. A lower formation temperature results in a higher work function of a first PMOS transistor, and a higher formation temperature results in a lower work function of a second PMOS transistor.

Figure 24:
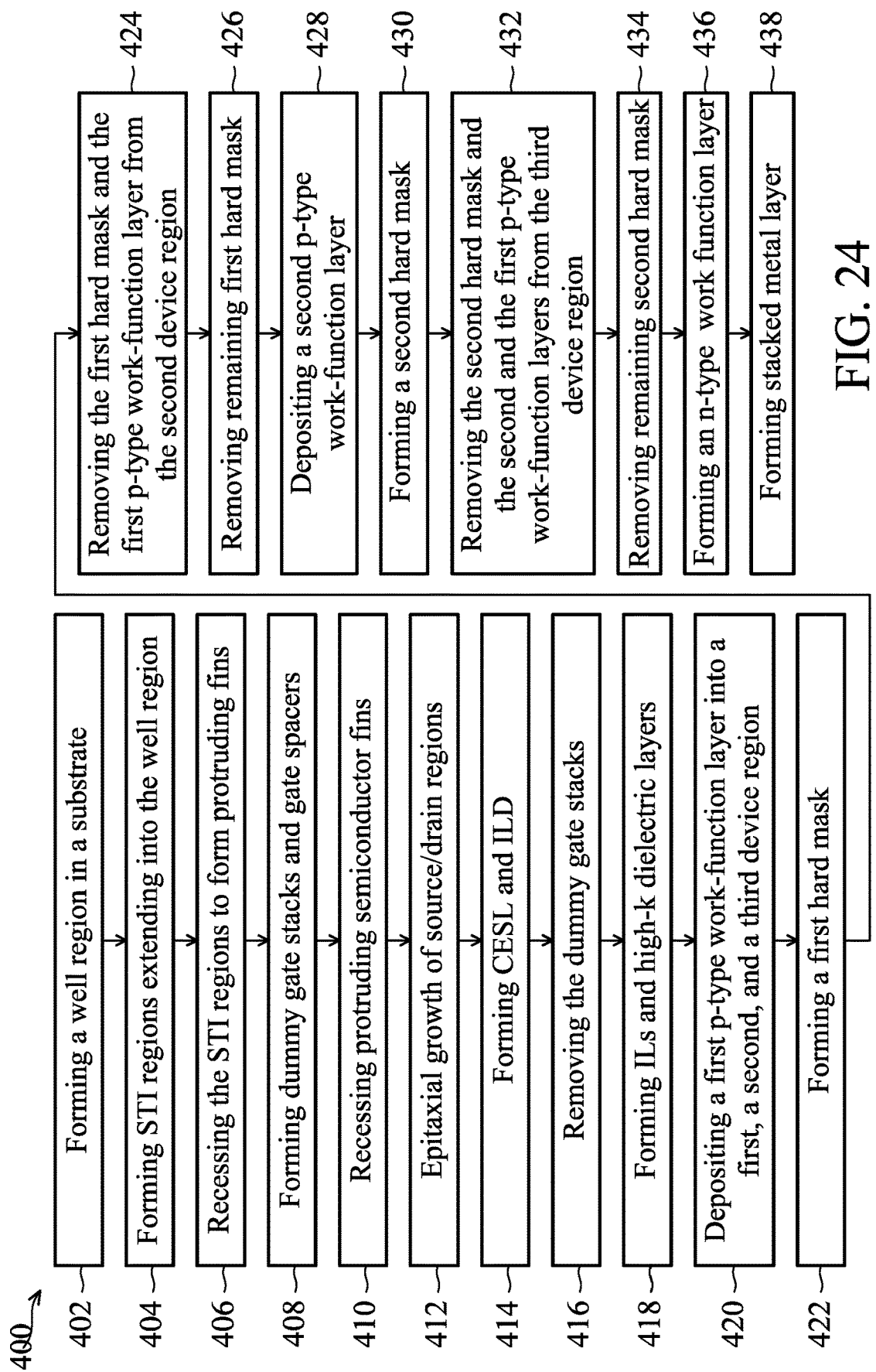
FIG. 24 illustrates a process flow for forming FinFETs in accordance with some embodiments.

FIGS. 1-6, 7A, 7B, 8A, 8B, 9-20, 21A, and 21B illustrate the cross-sectional views and perspective views of intermediate stages in the formation of Fin Field-Effect Transistors (FinFETs) in accordance with some embodiments of the present disclosure. The processes shown in these figures are also reflected schematically in the process flow 400 shown in FIG. 24.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including carbon-doped silicon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 402 in the process flow 400 shown in FIG. 24. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
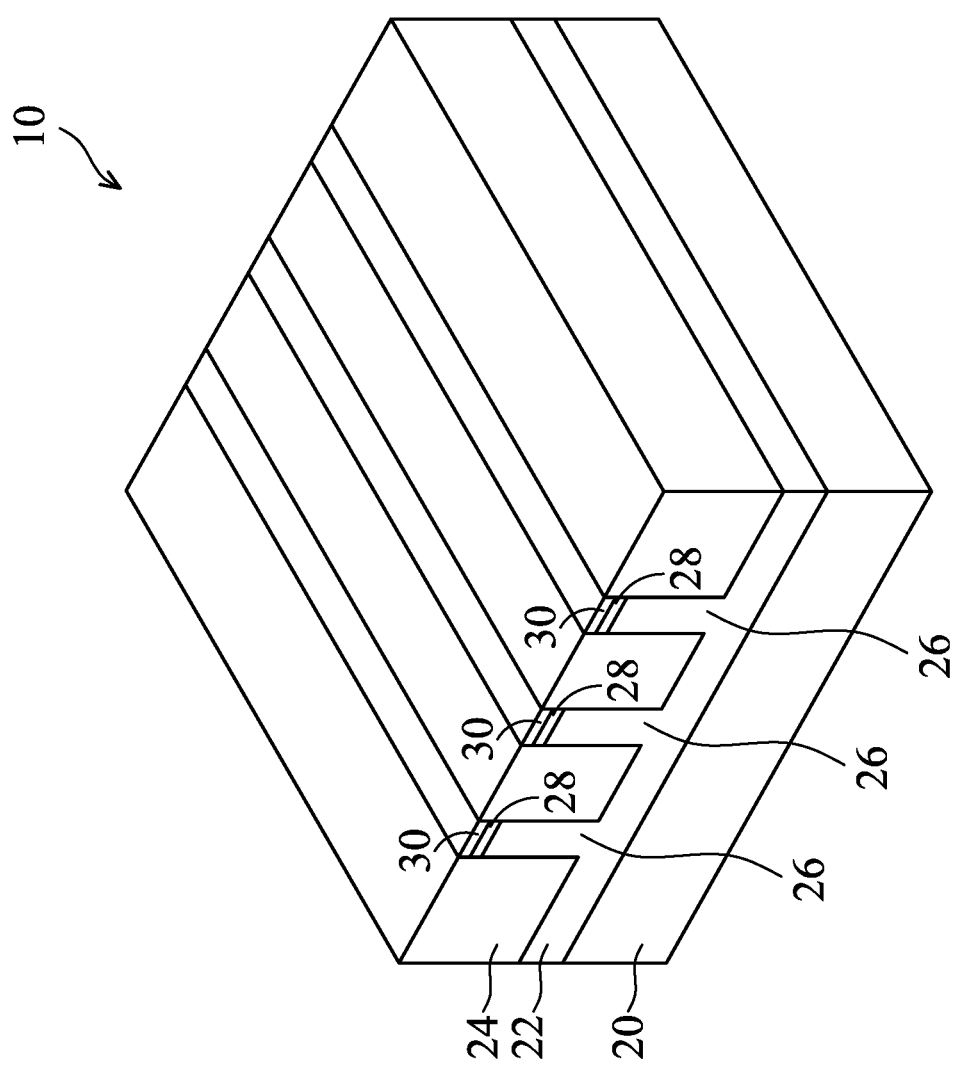

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 shown in FIG. 24. The portions of substrate 20 between neighboring STI regions 24 are referred to as semiconductor strips 26. To form STI regions 24, pad oxide layer 28 and hard mask layer 30 may be formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through the thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), Chemical Vapor Deposition (CVD), or the like. STI regions 24 also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard mask layers 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
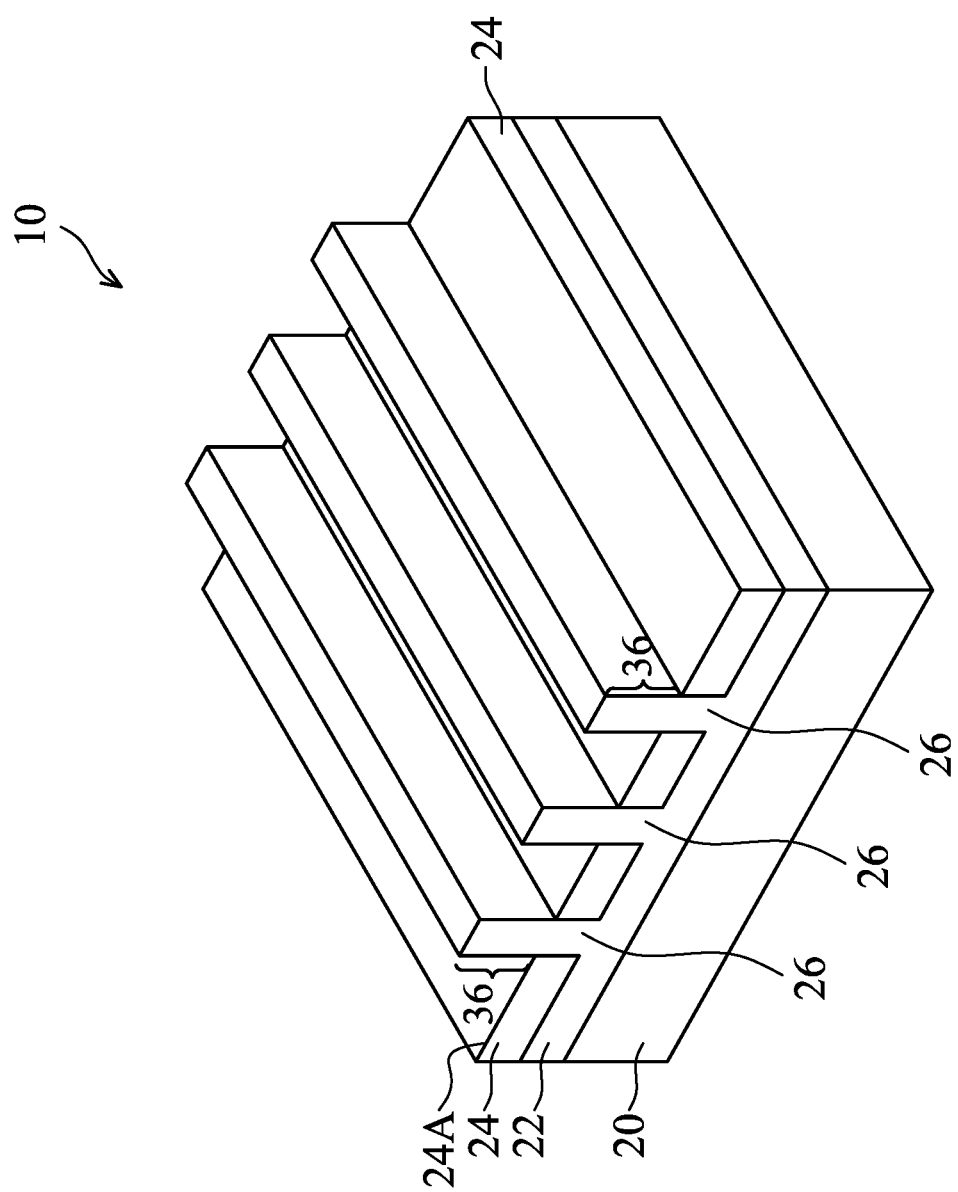

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 shown in FIG. 24. The etching may be performed using a dry etching process, wherein HF$_3$ and NH$_3$, for example, are used as the etching gases. During the etching process, plasma may be generated. Argon may also be included. In accordance with alternative embodiments of the present disclosure, the recessing of STI regions 24 is performed using a wet etch process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
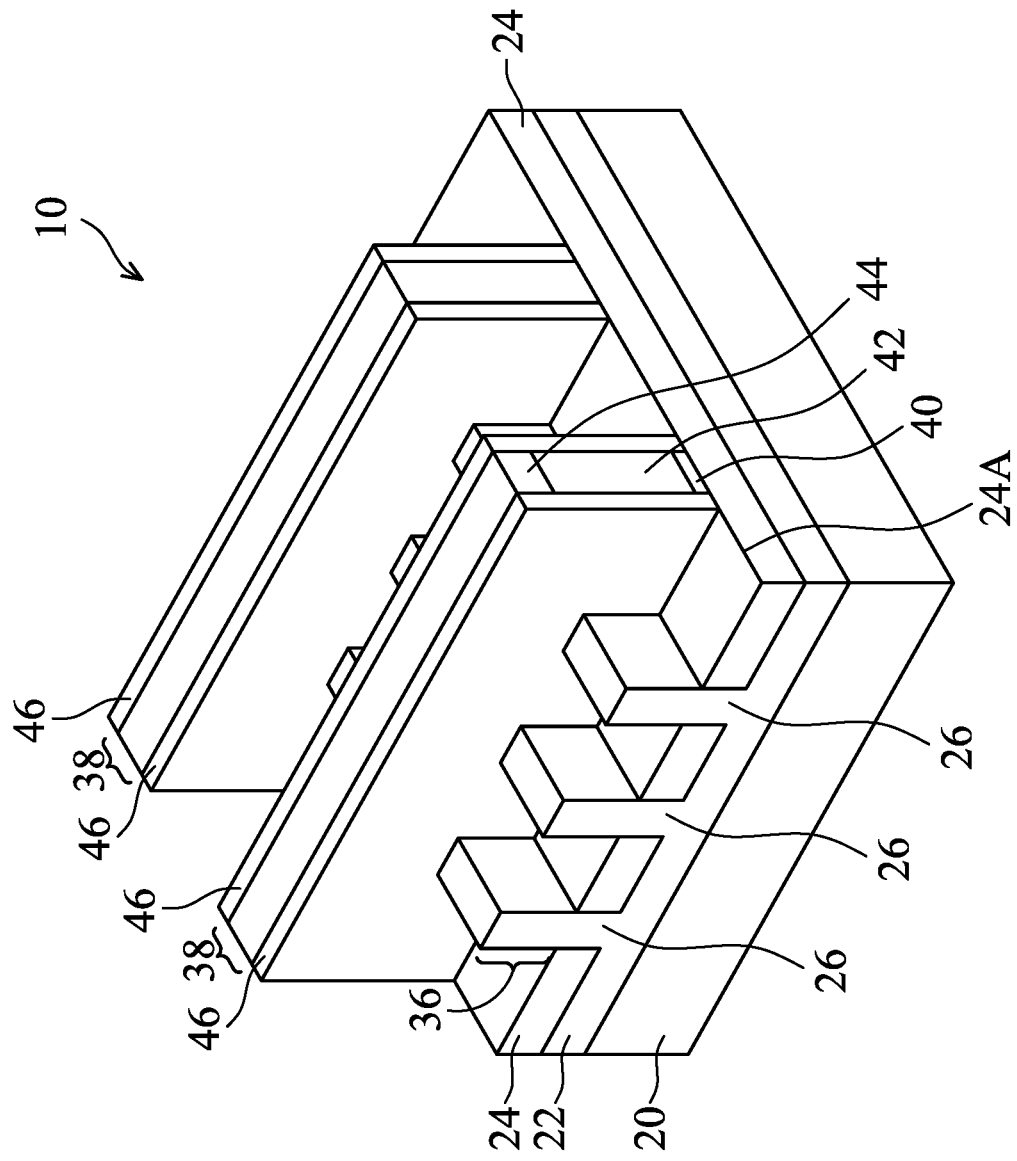

Referring to FIG. 4, dummy gate stacks 38 are formed to extend on the top surfaces and the sidewalls of (protruding) fins 36. The respective process is illustrated as process 408 in the process flow 400 shown in FIG. 24. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24.

Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 shown in FIG. 24. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 5:
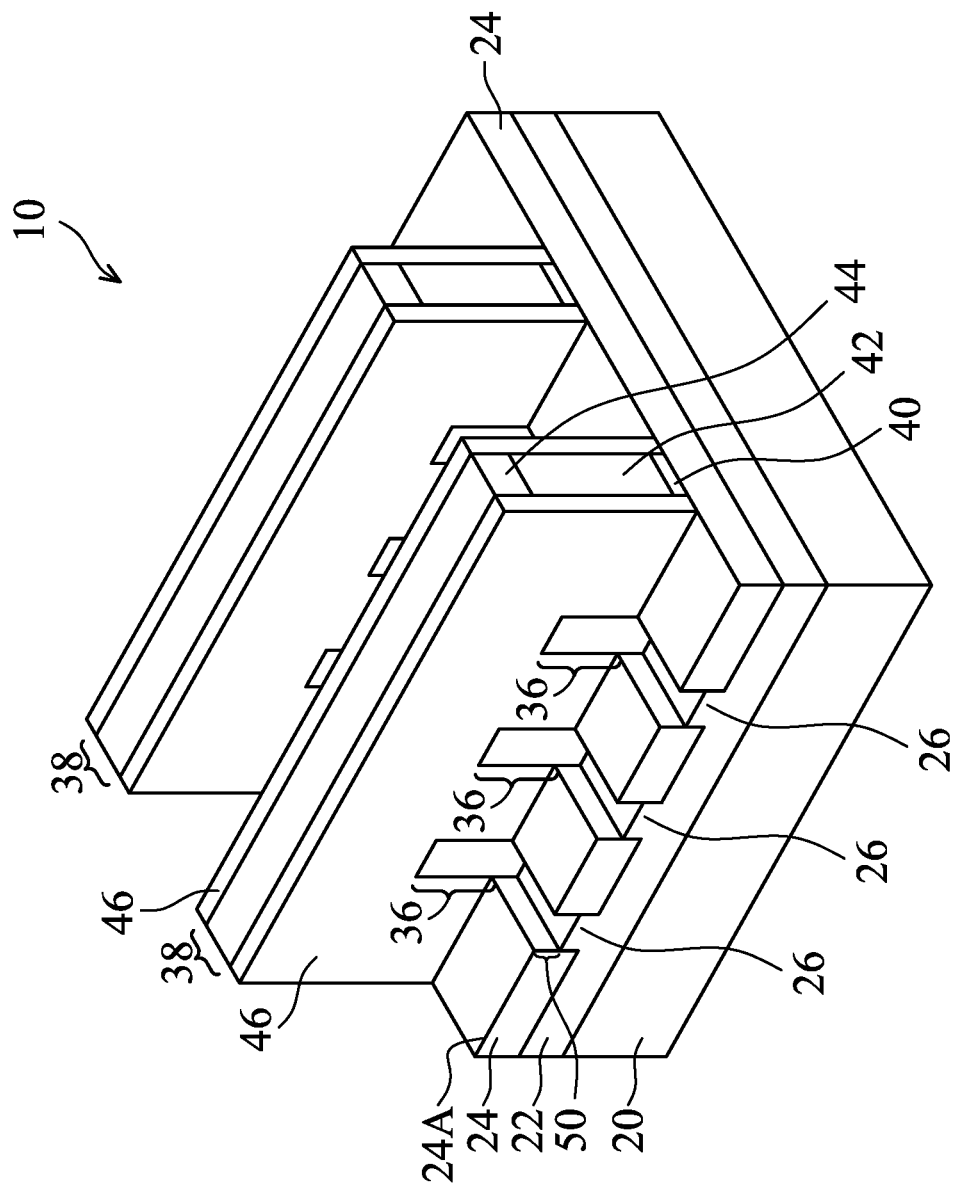

An etching process is then performed to etch the portions of protruding fins 36 that are not covered by dummy gate stacks 38 and gate spacers 46, resulting in the structure shown in FIG. 5. The respective process is illustrated as process 410 in the process flow 400 shown in FIG. 24. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between the remaining portions of protruding fins 36.

Figure 6:
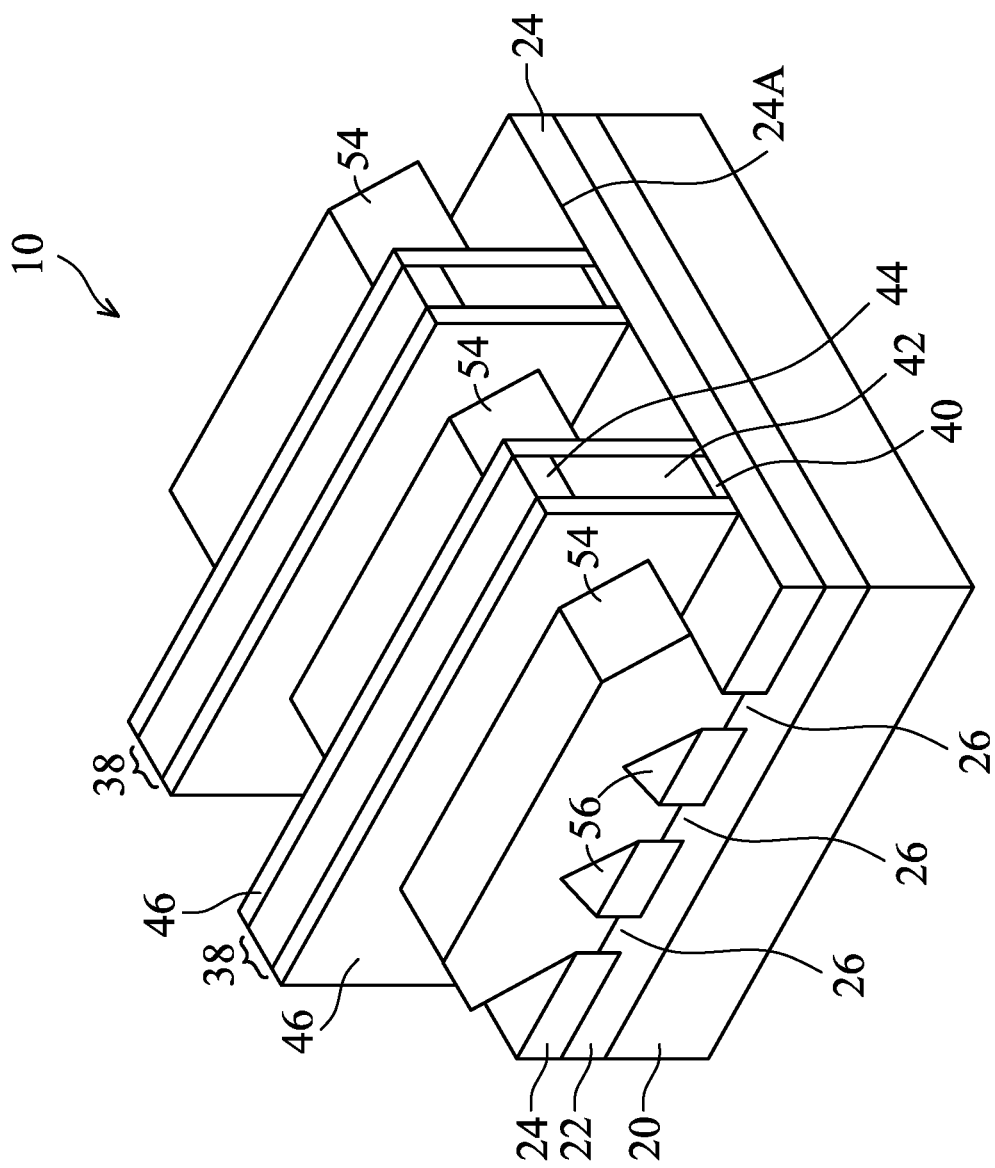

Next, epitaxy regions (source/drain regions) 54 are formed by selectively growing (through epitaxy) a semiconductor material in recesses 50, resulting in the structure in FIG. 6. The respective process is illustrated as process 412 in the process flow 400 shown in FIG. 24. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, the further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated.

After the epitaxy process, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 7A:
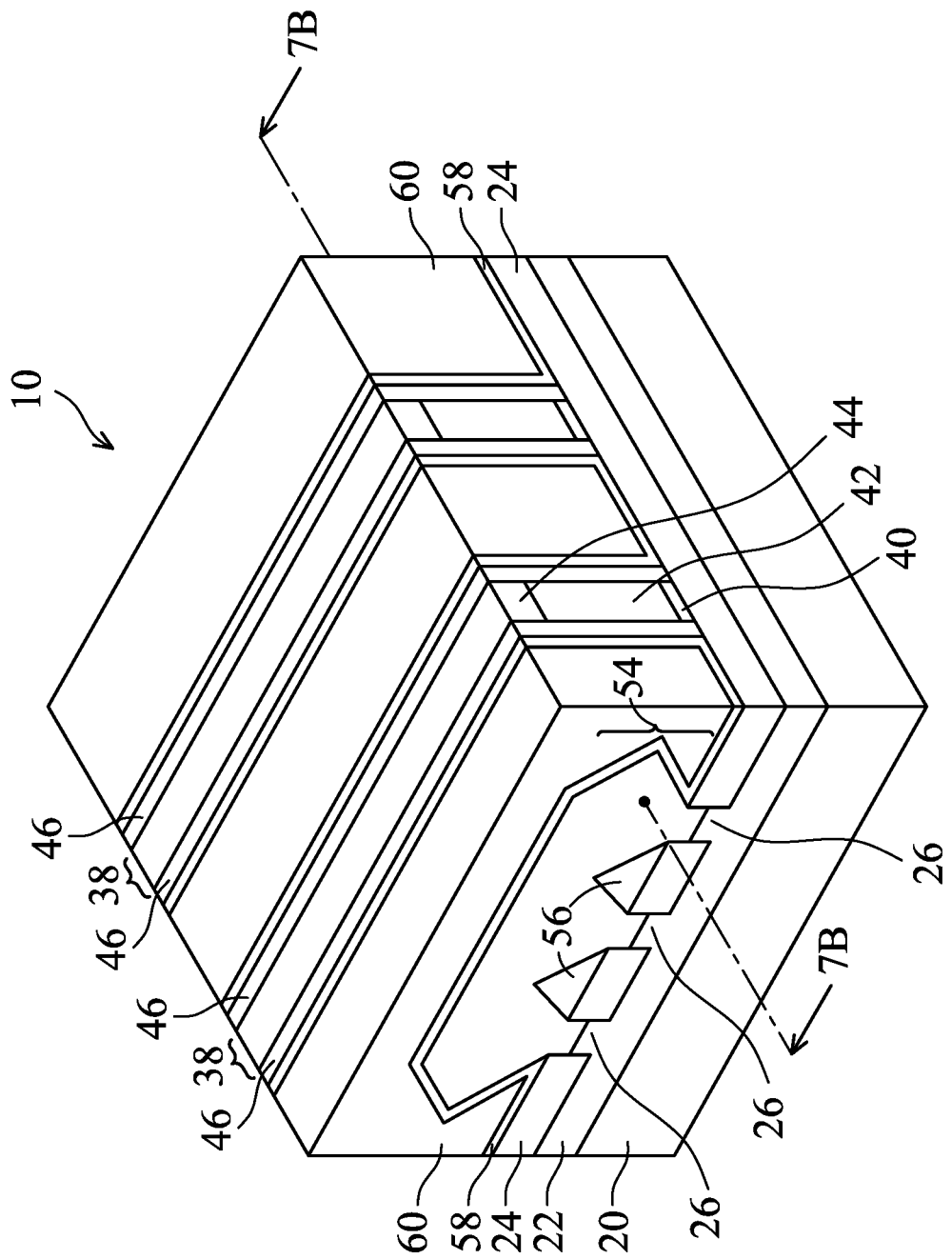

FIG. 7A illustrates a perspective view of the structure after the formation of Contact Etch Stop Layer (CESL) 58 and Inter-Layer Dielectric (ILD) 60. The respective process is illustrated as process 414 in the process flow 400 shown in FIG. 24. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
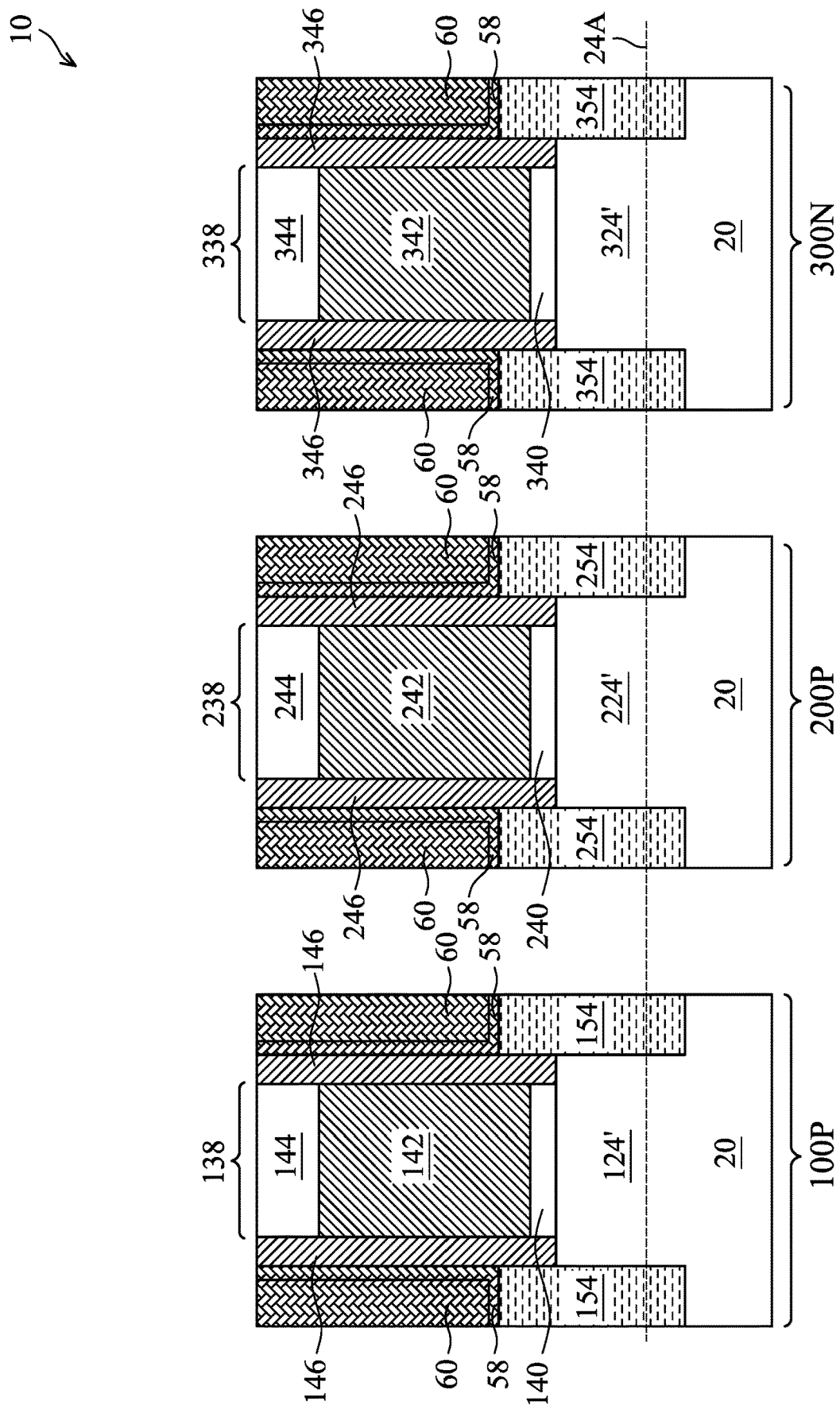

FIG. 7B illustrates the cross-sectional views of an intermediate structure in the formation of a first p-type FinFET, a second p-type FinFET, and an n-type FinFET (FinFETs 198, 298 and 398, respectively, in FIG. 21A) on the same substrate 20. In accordance with some embodiments, the first FinFET, the second FinFET, and the third FinFET are formed in device regions 100P, 200P, and 300N, respectively, wherein the letter "P" represents "p-type transistor", and the letter "N" represents "n-type transistor". In accordance with some embodiments, the FinFETs to be formed in device regions 100P and 200P have work-function layers with different work functions. The cross-sectional view of either one of the first FinFET, the second FinFET, and the third FinFET may correspond to the cross-sectional view obtained from the vertical plane containing line 7B-7B in FIG. 7A.

To distinguish the features in the first FinFET, the second FinFET, and the third FinFET, the features in the first p-type FinFET in FIG. 7B may be represented using the reference numerals of the corresponding features in FIG. 7A plus number 100, and the features in the second p-type FinFET in FIG. 7B may be represented using the reference numerals of the corresponding features in FIG. 7A plus number 200. Similarly, the features in the n-type FinFET in FIG. 7B may be represented using the reference numerals of the corresponding features in FIG. 7A plus number 300. For example, the source/drain regions 154, 254, and 354 in FIG. 7B correspond to source/drain regions 54 in FIG. 7A, and the gate spacers 146, 246, and 346 in FIG. 7B correspond to the gate spacers 46 in FIG. 7A. Source/drain regions 154 and 254 are doped with a p-type impurity or impurities. Source/drain regions 354 are doped with an n-type impurity or impurities. The corresponding features in the first FinFET, the second FinFET, and the third FinFET may be formed in common processes, with some of the example processes discussed in subsequent paragraphs, or may be formed in separate processes.

After the structure shown in FIGS. 7A and 7B is formed, the dummy gate stacks 138, 238, and 338 in FIG. 7B are replaced with metal gates and replacement gate dielectrics, as shown in FIGS. 8A, 8B, and 9-20. In these figures, the top surfaces 24A of STI regions 24 are illustrated, and semiconductor fins 124', 224' and 324' protrude higher than top surfaces 24A of the respective adjacent STI regions 24.

Figure 8A:
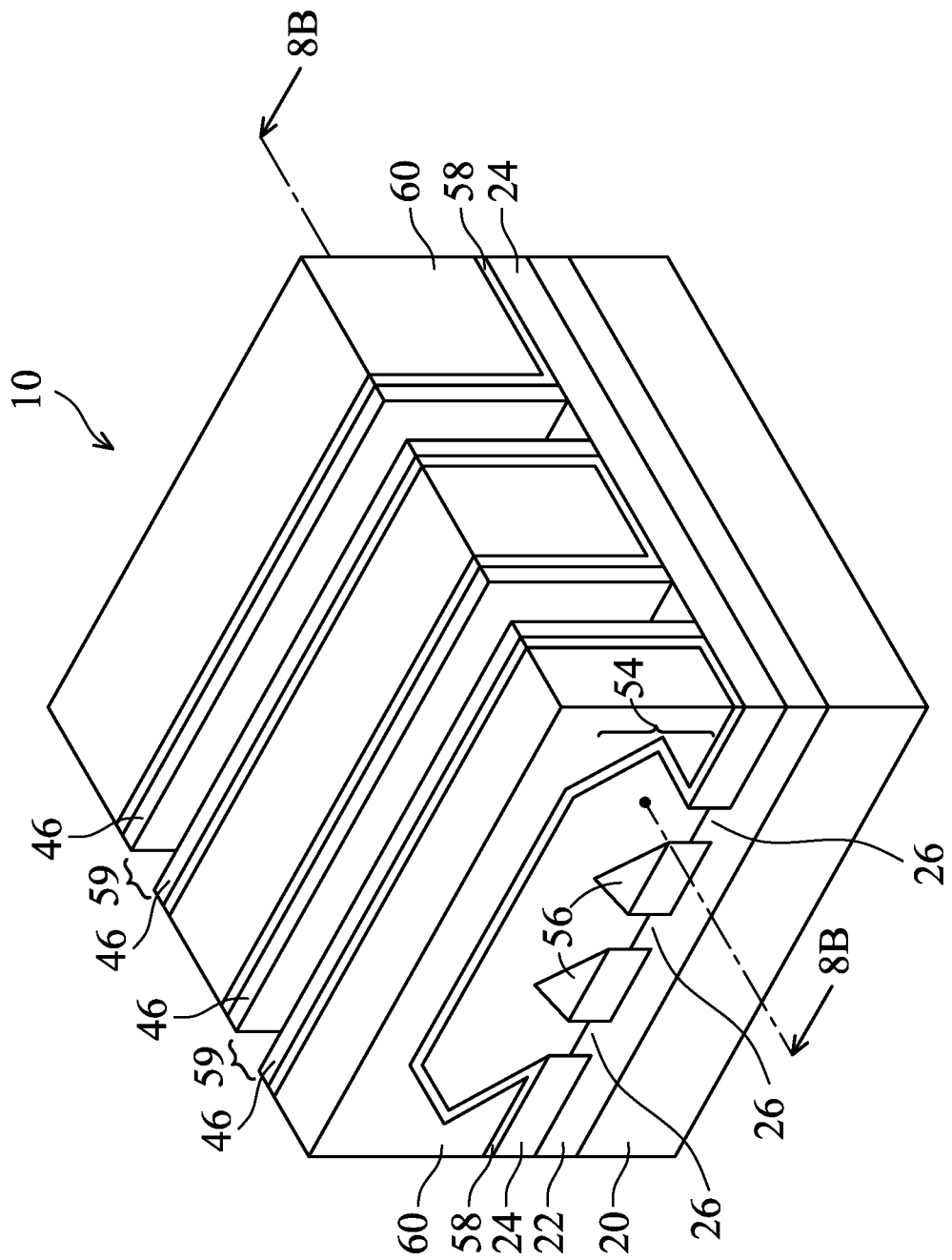
Figure 8B:
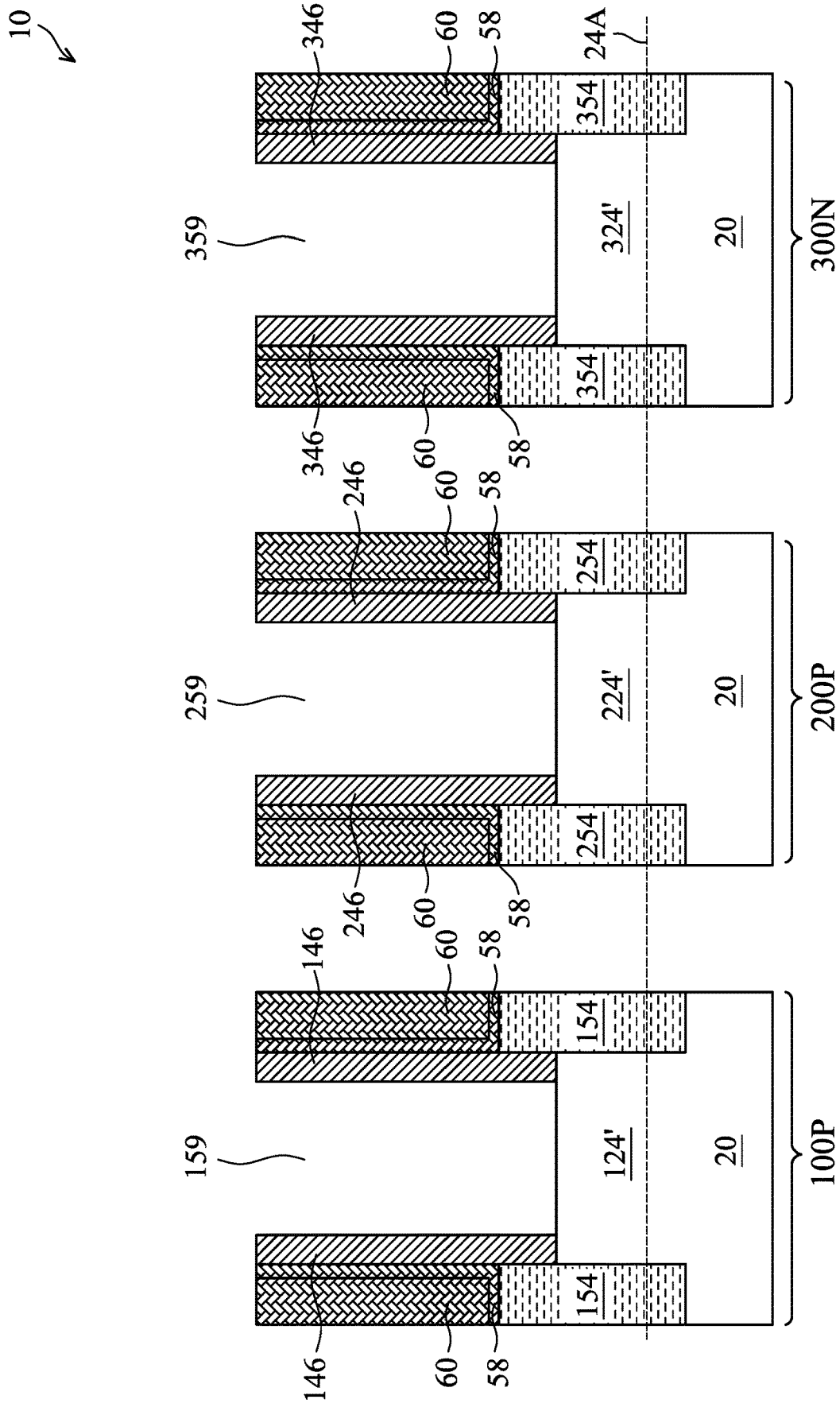

To form the replacement gates, hard mask layers 144, 244, and 344, dummy gate electrodes 142, 242, and 342, and dummy gate dielectrics 140, 240, and 340 as shown in FIGS. 7A and 7B are removed first, forming trenches 59 as shown in FIG. 8A. The respective process is illustrated as process 416 in the process flow 400 shown in FIG. 24. Trenches 59 in FIG. 8A correspond to trench 159 in device region 100P, trench 259 in device region 200P, and trench 359 in device region 300N in FIG. 8B. The top surfaces and the sidewalls of protruding fins 124', 224' and 324' are exposed to trenches 159, 259, and 359, respectively.

Figure 9:
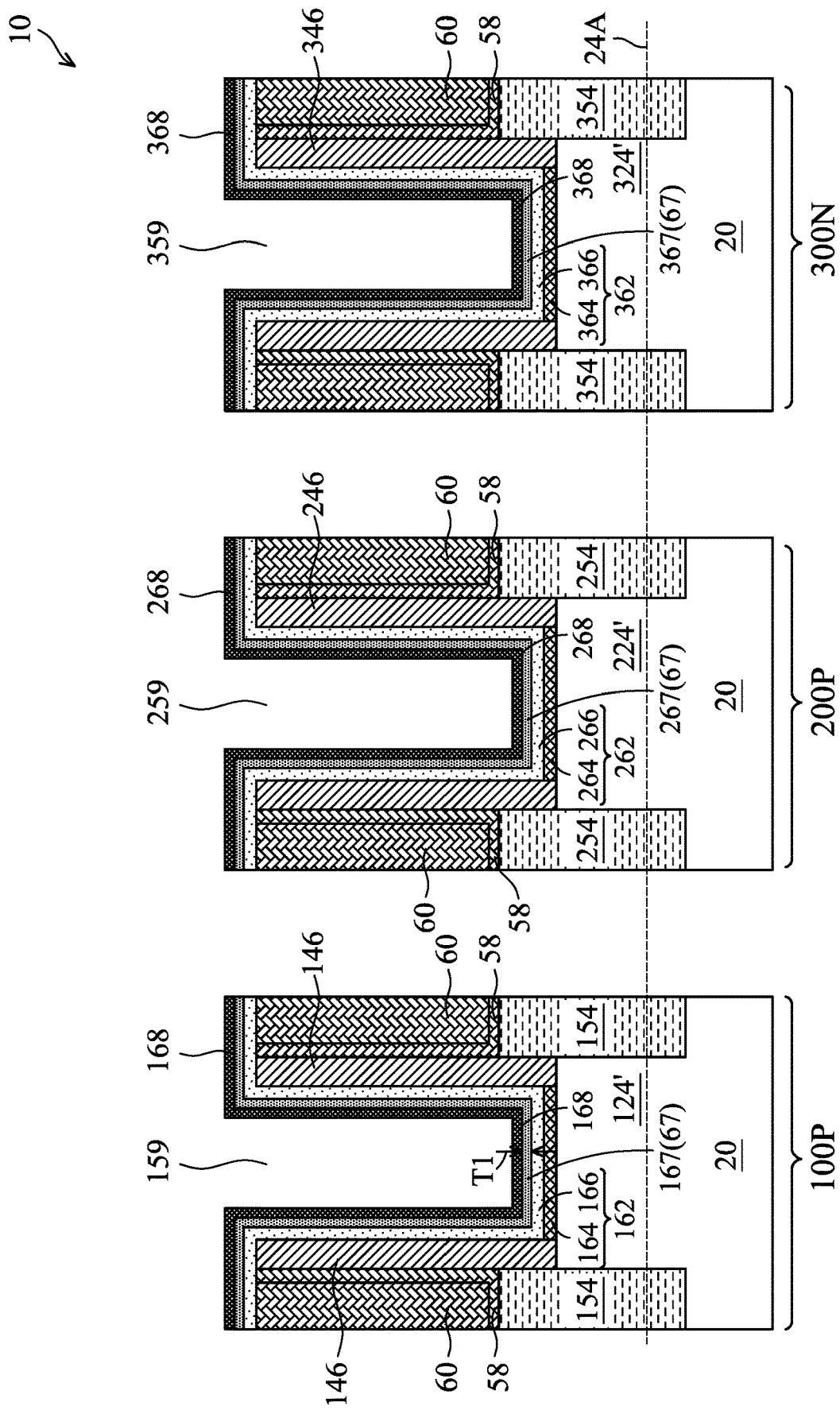

Next, referring to FIG. 9, gate dielectrics 162, 262, and 362, are formed, which extend into trenches 159, 259, and 359, respectively. The respective process is illustrated as process 418 in the process flow 400 shown in FIG. 24. In accordance with some embodiments of the present disclosure, the gate dielectrics 162, 262, and 362 include Interfacial Layers (ILs) 164, 264, and 364, respectively, which are formed on the exposed surfaces of protruding fins 124', 224', and 324', respectively. Each of ILs 164, 264, and 364 may include an oxide layer such as a silicon oxide layer, which is formed through the thermal oxidation of protruding fins 124', 224', and 324', a chemical oxidation process, or a deposition process. The gate dielectrics 162, 262, and 362 may also include high-k dielectric layers 166, 266, and 366, respectively, over the corresponding ILs 164, 264, and 364. Each of high-k dielectric layers 166, 266, and 366 may be formed of a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. High-k dielectric layers 166, 266, and 366 may have a thickness in the range between about 5 Å and about 30 Å. High-k dielectric layers 166, 266, and 366 are formed as conformal layers, and extend on the sidewalls of protruding fins 124', 224', and 324' and the top surface and the sidewalls of gate spacers 146, 246, and 346, respectively. In accordance with some embodiments of the present disclosure, high-k dielectric layers 166, 266, and 366 are formed using ALD or CVD. High-k dielectric layers 166, 266, and 366 may be portions of the same dielectric layer, which are formed simultaneously using the same material and having the same thickness, or separately with different materials and/or different thicknesses.

FIG. 9 further illustrates the formation of first p-type work-function layer 67, which includes p-type work-function layers (or portions) 167, 267, and 367. P-type work-function layers 167, 267, and 367 may be formed in a common deposition process or separate deposition processes. The respective process is illustrated as process 420 in the process flow 400 shown in FIG. 24. P-type work-function layer 67 may be formed of or comprise TiN, TiSiN, a composite layer including a TiSiN layer and a TiN layer over the TiSiN layer, or the like. The formation method includes a conformal deposition method such as Atomic Layer Deposition (ALD). The thickness T1 of p-type work-function layer 67 may be in the range between about 10 Å and about 50 Å.

In accordance with some embodiments, p-type work-function layer 67 is a TiN layer formed using ALD. The precursor may include $TiCl_4$ and $NH_3$. The corresponding ALD process includes a plurality of cycles, each including conducting $TiCl_4$, purging $TiCl_4$, conducting $NH_3$, and then purging $NH_3$. Alternatively, p-type work-function layer 67 is a TiSiN layer formed using ALD. The precursor may include $TiCl_4$, $SiH_4$, and $NH_3$. The corresponding ALD process includes a plurality of cycles, each including conducting $TiCl_4$, purging $TiCl_4$, conducting $NH_3$, purging $NH_3$, conducting $SiH_4$, purging $SiH_4$, conducting $NH_3$, and then purging $NH_3$. For example, in each cycle, $TiCl_4$ may be conducted for about 0.1 seconds to about 30 minutes, with the flow rate in the range between about 100 sccm and about 9,000 sccm. $NH_3$ may be conducted for about 0.1 seconds to about 30 minutes, with the flow rate in the range between about 100 sccm and about 9,000 sccm. The chamber pressure may be in the range between about 0.5 torr and about 40 torr.

Figure 22:
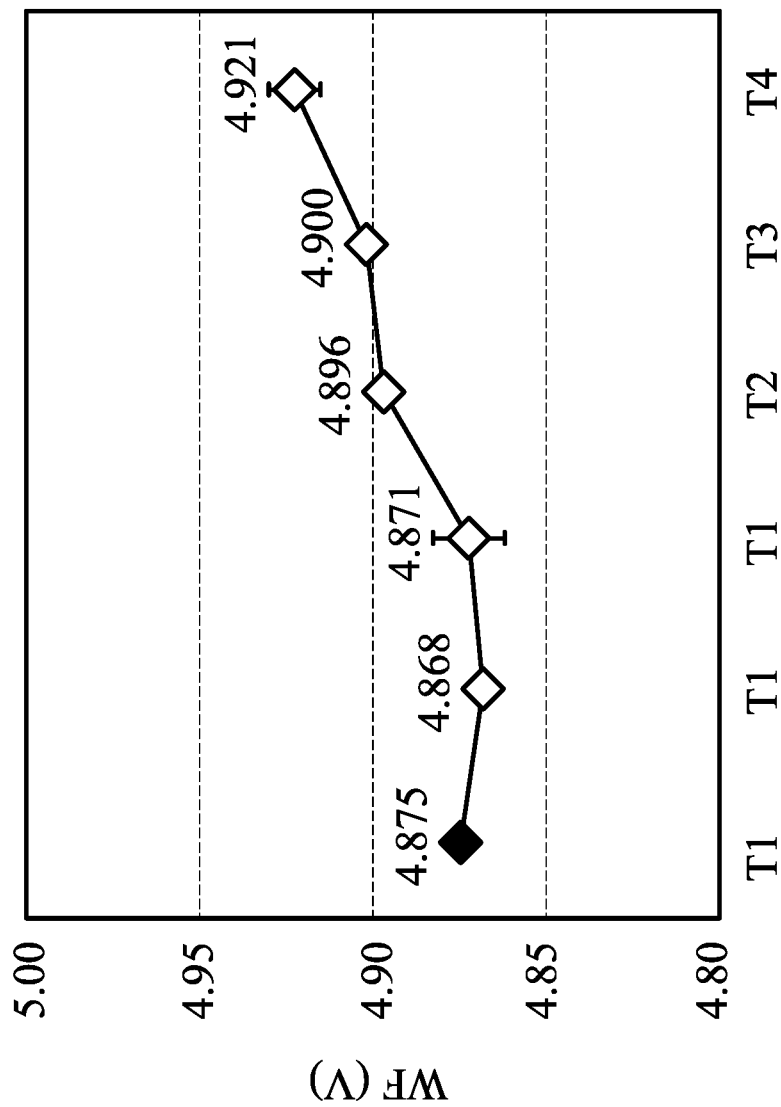
FIG. 22 illustrates the work functions of titanium nitride layers as a function of formation temperature in accordance with some embodiments.

The temperature of wafer 10 during the deposition of p-type work-function layer 67 is at a relatively high temperature, so that the work function of p-type work-function layer 67 is relatively low. Experiments revealed that the work functions of work-function layers are affected by the deposition temperature of the work function layers. For example, FIG. 22 illustrates the relationship of the work functions of TiN as a function of the deposition temperatures. Three of the sample TiN layers are formed at T1, which is the highest among the testing temperatures, and the corresponding work functions are around 4.87 eV. When the deposition temperatures reduce to lower temperatures T2, T3, and T4, with T2>T3>T4, the work functions of the respective sample TiN layers increase to about 4.896 eV, 4.9 eV, and about 4.921 eV, respectively. Accordingly, when the deposition temperatures reduce from T1 to T4, the work function is increased by about 53 mV. Hence, by selecting appropriate deposition temperatures, the work functions of work-function layers may be adjusted. Accordingly, the threshold voltages of the transistors may also be adjusted through adjusting the deposition temperature of the work-function layers. In accordance with some embodiments, the FinFET in device region 100P has a work-function layer deposited at a higher temperature to have a relatively low work function, and the FinFET in device region 200P has a work-function layer deposited at a lower temperature to have a relatively high work function. As a result, the threshold voltages of the FinFETs in device regions 100P and 200P may be different from each other.

Figure 23:
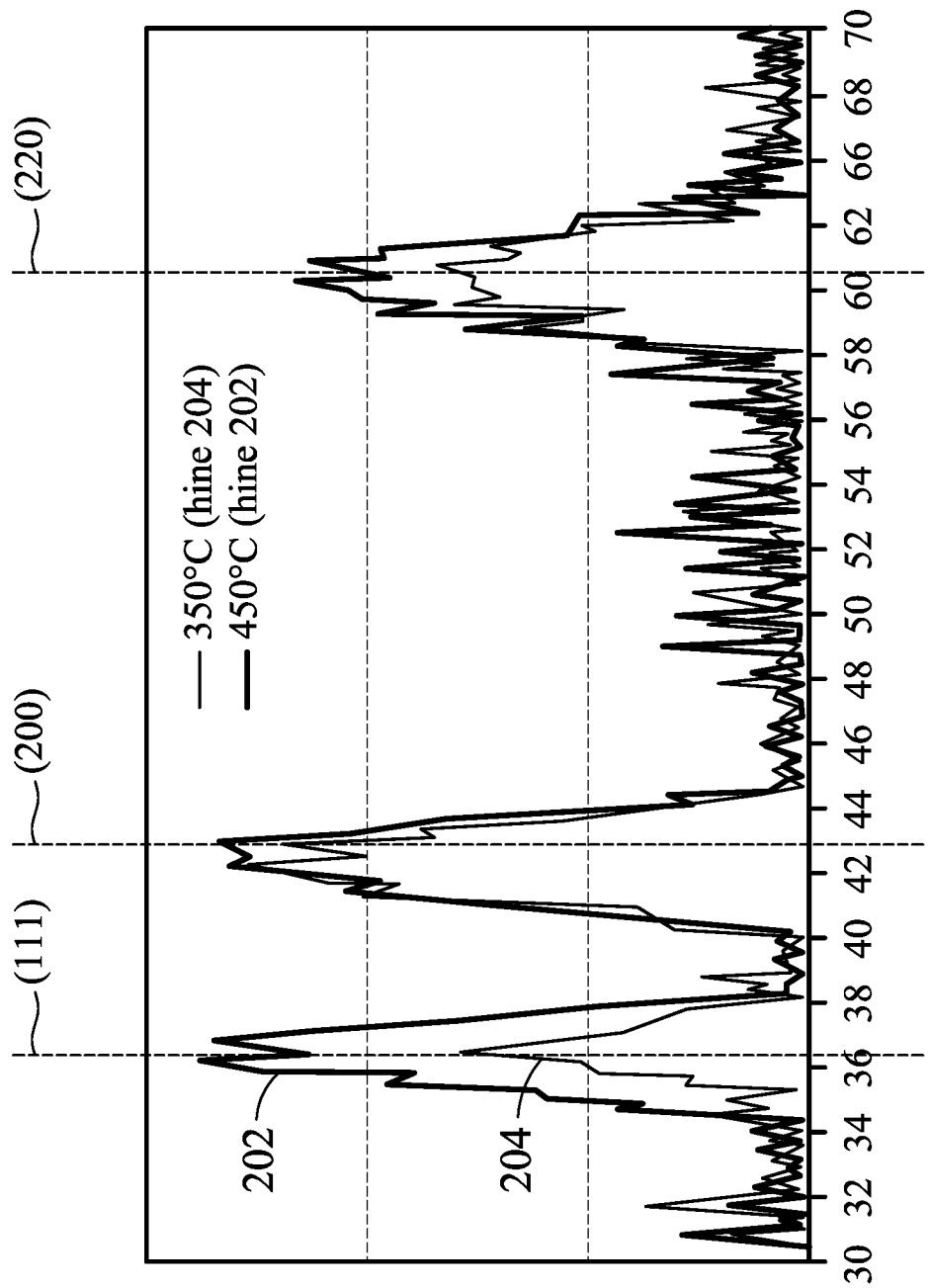
FIG. 23 illustrates the X-Ray Diffraction (XRD) results of two titanium nitride layers formed at 350° C. and 450° C. in accordance with some embodiments.

In accordance with some embodiments, the temperature of wafer 10 in the deposition of work-function layers 67 is relatively high, for example, in the range between about 400° C. and about 500° C., and may be in the range between about 425° C. and about 475° C. This results in the work function of work-function layer 67 to be relatively low, as shown by FIG. 22. An X-Ray Diffraction (XRD) analysis is performed on the sample TiN work-function layers deposited at 450° C. A resulting plot is shown as line 202 in FIG. 23. The Y-axis indicates the signal intensity, and the X-axis is the incident angle of the X-ray on the samples. The samples have characteristic peaks (111) and (200). As shown by line 202, the (200)/(111) signal intensity ratio, which is the ratio of the (200) signal intensity to the (111) signal intensity, is around 0.95 when the TiN sample is deposited at 450° C. As a comparison, the (200)/(111) signal intensity ratio of the TiN samples deposited at 350° C. is 1.64. Accordingly, the (200)/(111) signal intensity ratios of the work-function layers may be used to identify their formation temperatures.

When the temperature of wafer 10 in the deposition of work-function layers 67 is in the range between about 400° C. and about 500° C., the corresponding (200)/(111) signal intensity ratio may be in the range between about 0.9 and about 0.99. The work function of work-function layer 67 may be in the range between about 4.85 eV and about 4.88 eV. Furthermore, due to the relatively high deposition temperature, less residue chlorine (due to the use of $TiCl_4$ as a precursor) is left in the resulting work-function layers 67 (and the final work-function layer 167). For example, the chlorine atomic percentage in p-type work-function layer 67/167 may be lower than about 0.11 percent, and may be in the range between about 0.01 percent and about 0.1 percent. The atomic percentages of chlorine (and other elements) may be determined by using X-ray Photoelectron Spectroscopy (XPS), for example.

FIG. 9 further illustrates the formation of first hard masks 168, 268, and 368, which are formed in a common deposition process. The respective process is illustrated as process 422 in the process flow 400 shown in FIG. 24. In accordance with some embodiments, hard masks 168, 268, and 368 are single-layer hard masks or multi-layer hard masks. In accordance with some embodiments, hard masks 168, 268, and 368 include a metal oxide layer such as an aluminum oxide layer, and a metal nitride layer such as a titanium nitride layer over the metal oxide layer. Hard masks 168, 268, and 368 may be formed using a conformal deposition method such as ALD, CVD, or the like.

Figure 10:
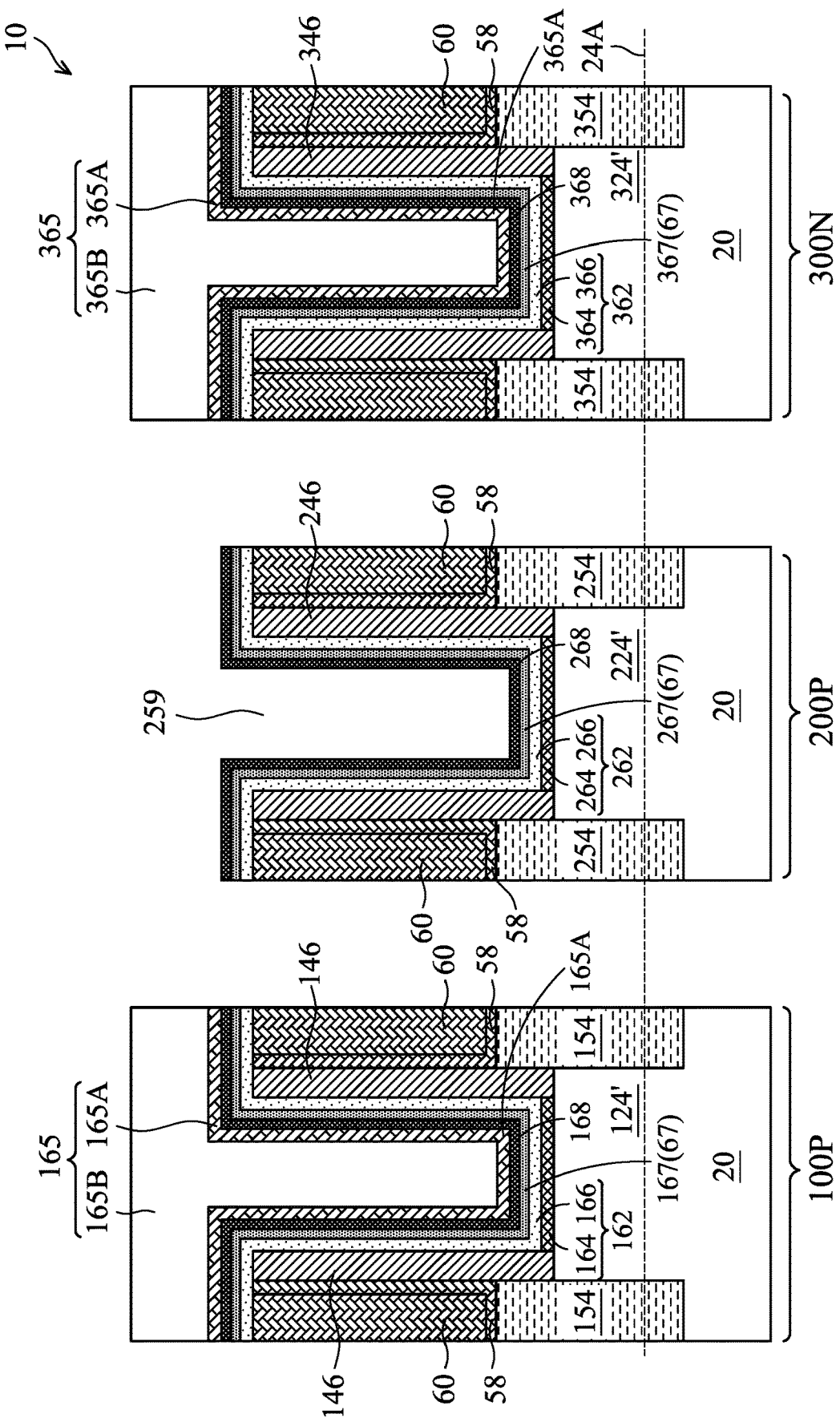
Figure 11:
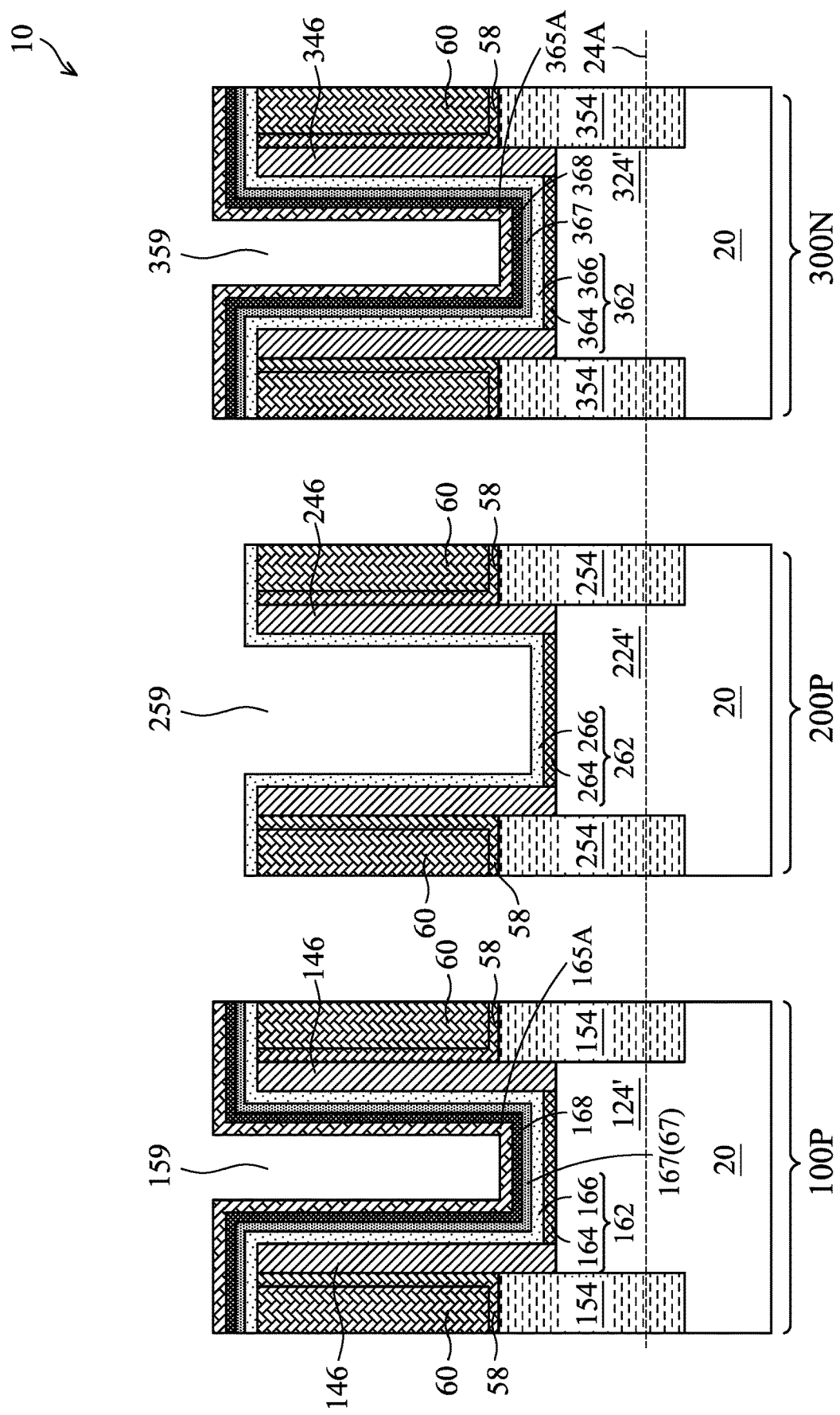

FIG. 10 illustrates the formation and the patterning of etching masks 165 and 365 in device regions 100P and 300N, respectively. Etching masks 165 and 365 may be formed to extend into device regions 100P, 200P, and 300N, and then removed from device region 200P in a patterning process. As a result, hard mask 268 is exposed, while hard masks 168 and 368 are covered by etching mask 165 and 365, respectively. In accordance with some embodiments, etching mask 165 includes Bottom Anti-Reflective Coating (BARC) 165A and photo resist 165B, and etching mask 365 includes BARC 365A and photo resist 365B. In an example formation process, the formation of BARCs 165A and 365A and photo resists 165B and 365B include forming a blanket BARC layer, and forming a photo resist on the blanket BARC layer. The photo resist is patterned using a lithography process to remove a portion from device region 200P. The blanket BARC layer is then etched using photo resists 165B and 365B as an etching mask. After the etching of the blanket BARC layer, photo resists 165B and 365B are removed, and BARCs 165A and 365A are exposed, as shown in FIG. 11.

In accordance with alternative embodiments, etching masks 165 and 365 are formed of a single photo resist or a tri-layer, which includes a bottom layer, a middle layer over the bottom layer, and a top layer over the middle layer. In accordance with yet alternative embodiments, etching masks 165 and 365 are parts of a single-photo-resist layer. The remaining photo resists 165B and 365B may be removed prior to or during the process shown in FIG. 11.

Next, hard mask 268 and p-type work-function layer 267 are removed in an etching process(es). The respective process is illustrated as process 424 in the process flow 400 shown in FIG. 24. The resulting structure is shown in FIG. 11. Hard masks 168 and 368 are protected by BARCs 165A and 365A, and will remain after the etching process. After the etching of hard mask 268, p-type work-function layer 267 is exposed.

The exposed p-type work-function layer 267 is then removed in an etching process, and high-k dielectric layer 266 is exposed after the etching process. In accordance with some embodiments of the present disclosure, the etching of p-type work-function layer 267 is performed through a wet etching process. In accordance with some embodiments, the same wet etching chemical for etching hard mask 268 may be used for etching p-type work-function layer 267. It is appreciated that the removal of both hard mask 268 and p-type work-function layer 267 is performed using the same etching masks 165 and 365 (BARCs 165A and 365A). Hard masks 168 and 368, although not used as etching masks for etching p-type work-function layer 267, has the function of controlling the etching width of p-type work-function layer 267 to prevent the over-etching of p-type work-function layer 267 in the lateral direction.

Figure 12:
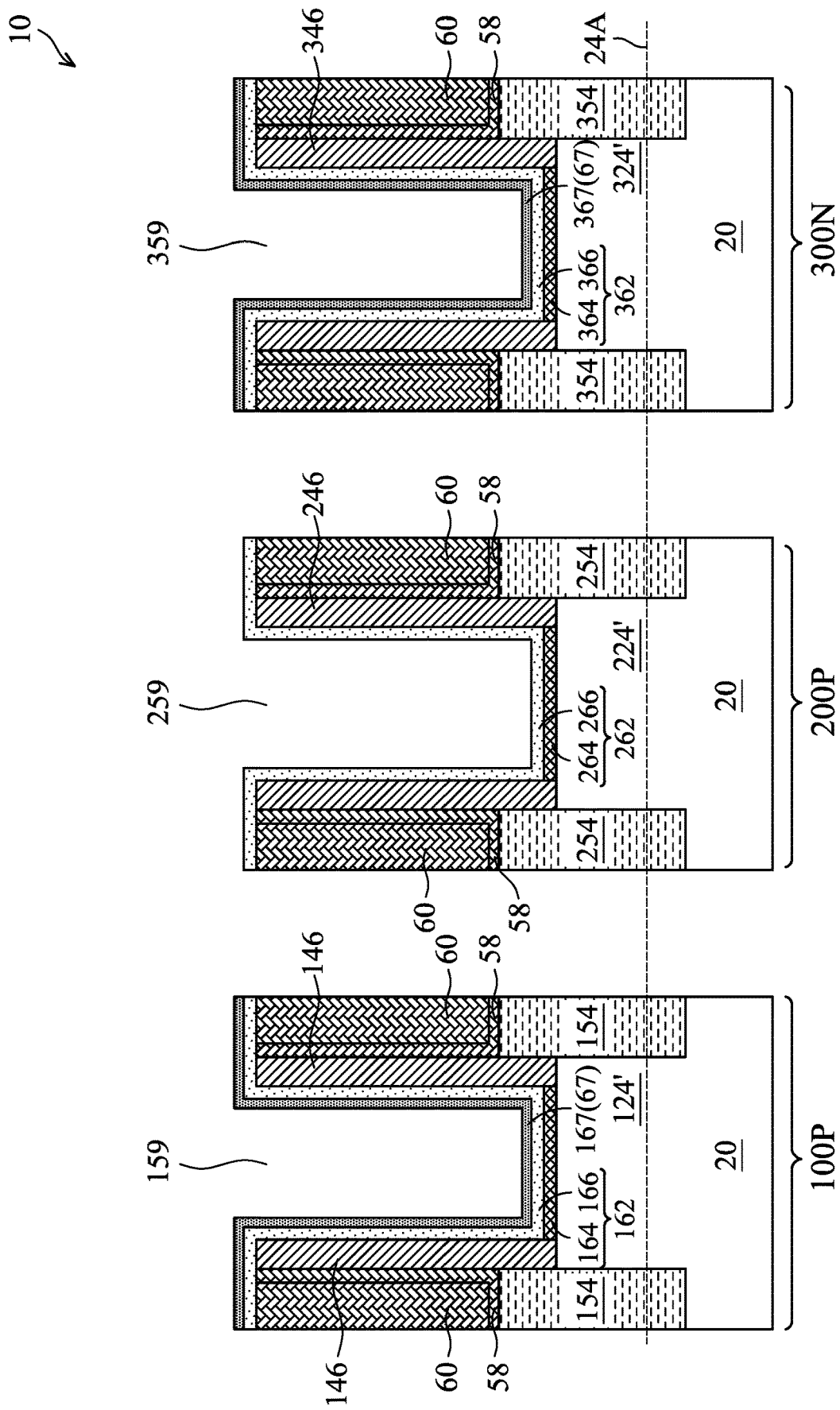

Next, BARCs 165A and 365A are removed. In accordance with some embodiments, BARCs 165A and 365A are removed through ashing, or removed using an etching gas comprising hydrogen ($H_2$) and nitrogen ($N_2$), wherein no bias voltage is applied. The resulting structure is shown in FIG. 12. Hard masks 168 and 368 are accordingly exposed. The remaining hard masks 168 and 368 are then removed. The respective process is illustrated as process 426 in the process flow 400 shown in FIG. 24. The etching chemical may include ammonium hydroxide, hydrogen peroxide, hydrochloric acid, carbonic acid, and the like.

Figure 13:
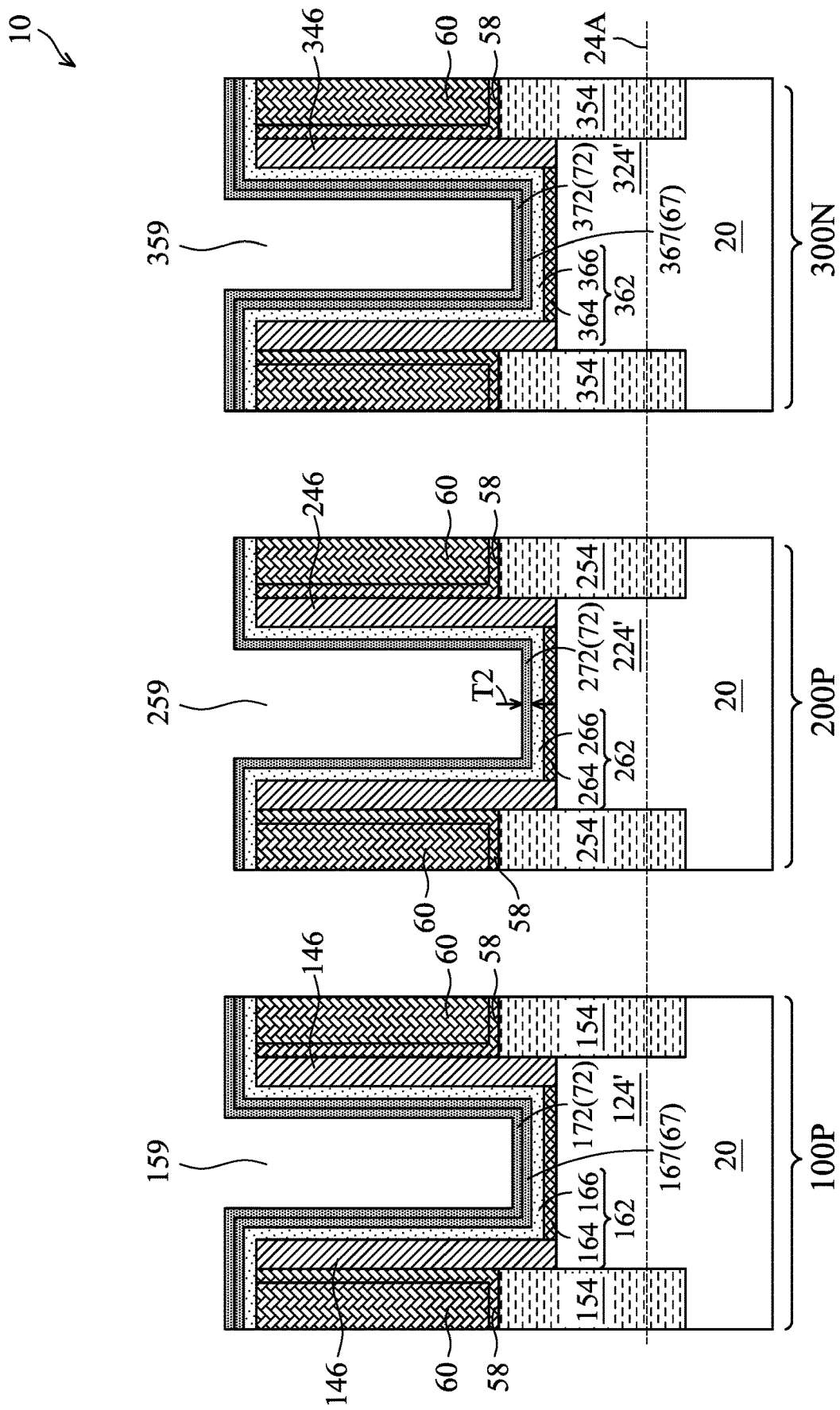

FIGS. 13 through 16 illustrate the deposition and the patterning of second p-type work-function layer 72, which includes layers (or portions) 172, 272, and 372 in transistors regions 100P, 200P and 300N, respectively. Referring to FIG. 13, p-type work-function layer 72 (including 172, 272, and 372) is formed, for example, in a same deposition process. The respective process is illustrated as process 428 in the process flow 400 shown in FIG. 24. The material of p-type work-function layers 172, 272, and 372 may be selected from the same group of candidate materials of p-type work-function layer 167, and may be the same as or different from the material of p-type work-function layer 167. The thickness T2 of p-type work-function layers 172, 272, and 372 may be in the range between about 10 Å and about 50 Å. In accordance with some embodiments, p-type work-function layers 67 and 72 are formed of or comprise the same elements such as titanium and nitrogen, and the atomic percentages of the elements in p-type work-function layer 67 may be the same as (or different from) the atomic percentages of the corresponding elements in p-type work-function layer 72.

In accordance with some embodiments, p-type work-function layer 67 is formed using ALD, with $TiCl_4$ and $NH_3$ being used as the precursors. The deposition temperature of work-function layer 72 is lower than the deposition temperature of work-function layer 67. The difference of the deposition temperature of work-function layer 72 to the deposition temperature of work-function layer 67 may be greater than about 50° C., or in the range between about 50° C. and about 150° C., so that there is an adequately distinction between the work functions of work-function layers 67 and 72. The deposition temperature of work-function layer 72 cannot be too high or too low. If the deposition temperature is too low, for example, lower than about 300° C., there may be too much chlorine left in the resulting work-function layer 272, which adversely affects the performance of the resulting transistor. If the deposition temperature is too high, for example, higher than about 400° C., the effect of increasing work function is reduced, defeating the purpose of forming work-function layers 67 and 72 using separate processes and different temperatures. In accordance with some embodiments, the deposition temperature of work-function layer 72 is in the range between about 300° C. and about 400° C., and may be in the range between about 325° C. and about 375° C. The work function of work-function layer 72 may be in the range between about 4.88 eV and about 4.51 eV. The work function $WF_{72}$ of work-function layer 72 and the work function $WF_{67}$ of work-function layer 67 have a difference ($WF_{72}-WF_{67}$) greater than about 20 mV, which difference may be in the range between about 20 mV and about 70 mV.

Due to the relatively low deposition temperature for depositing work-function layer 72, more residue chlorine (due to the use of $TiCl_4$ as a precursor) is left in the resulting work-function layer 72 than in work-function layer 67. For example, the chlorine atomic percentage in work-function layer 72 may be higher than about 1 percent, and may be in the range between about 1 percent and about 4.5 percent.

An XRD analysis is performed on the sample TiN work-function layers deposited at 350° C. The resulting plot is shown as line 204 in FIG. 23. As shown by line 204, the (200)/(111) (signal intensity) ratio is around 1.64 when the TiN sample is deposited at 350° C. In accordance with some embodiments, when the temperature of wafer 10 in the deposition of work-function layers 72 is in the range between about 300° C. and about 400° C., the corresponding (200)/(111) signal intensity ratio is greater than about 1.4, and may be in the range between about 1.4 and about 1.8. Furthermore, the (200)/(111) signal intensity ratio of work-function layer 72 is greater than the (200)/(111) signal intensity ratio of work-function layer 67 by a difference greater than bout 0.35, and may be in the range between about 0.35 and about 0.7. The signal peaks and the (200)/(111) signal intensity ratio may be found in the final product, for example, the corresponding chip that has been packaged.

Figure 14:
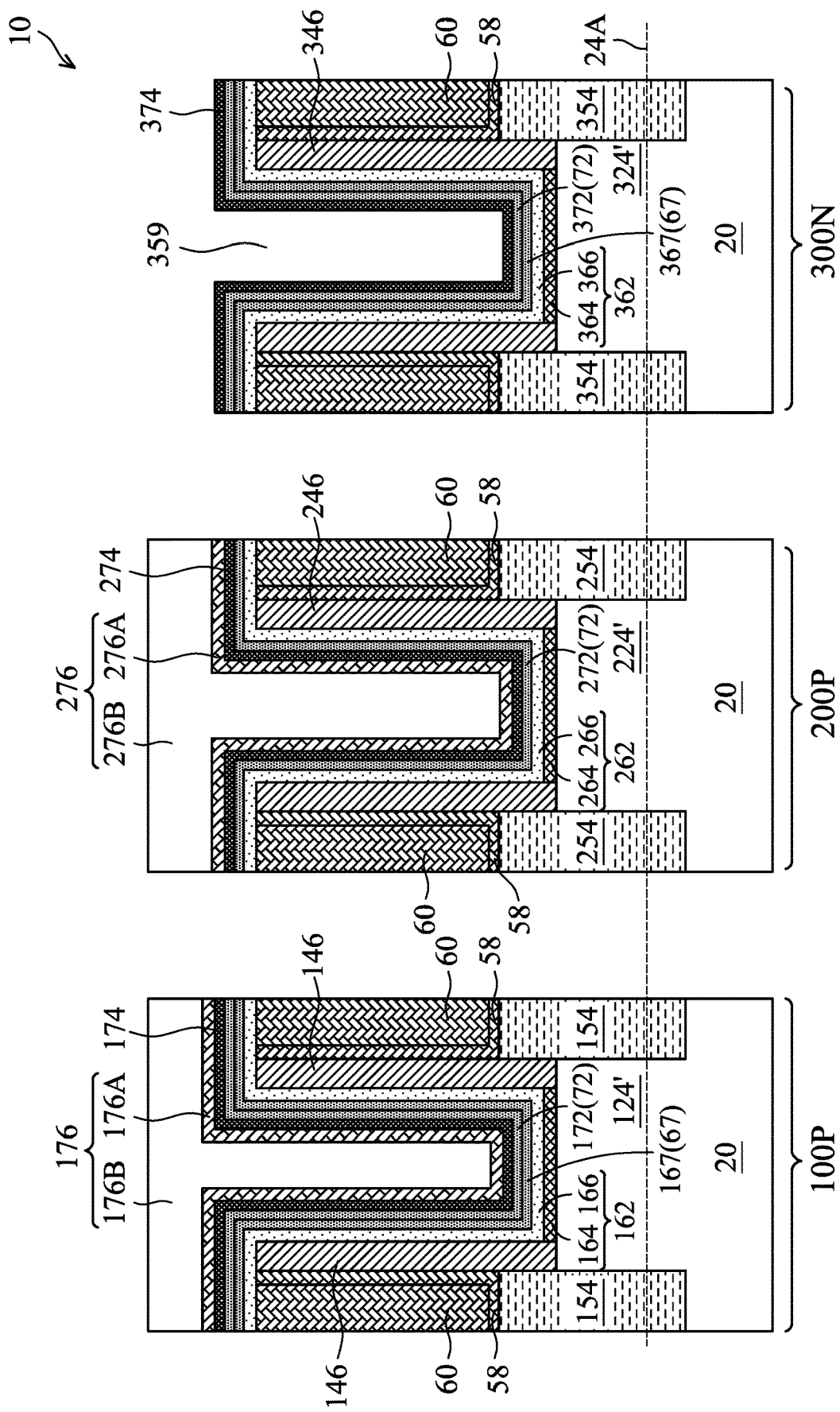

FIG. 14 further illustrates the formation of second hard masks 174, 274, and 374, which are formed in a common deposition process. The respective process is illustrated as process 430 in the process flow 400 shown in FIG. 24. The material, the structure, and the formation method of hard masks 174, 274, and 374 may be selected from the same group of candidate materials, structures, and formation methods of hard masks 168, 268, and 368 (FIG. 9). The thickness of hard masks 174, 274, and 374 may be in the range between about 5 Å and about 50 Å.

FIG. 14 also illustrates the formation and the patterning of etching masks 176 and 276 in device regions 100P and 200P, respectively. Etching masks 176 and 276 may be formed to extend into device regions 100P, 200P, and 300N, and then removed from device region 300N in a patterning process. Etching mask 176 may include BARC 176A, and photo resist 176B over BARC 176A. Etching mask 276 may include BARC 276A, and photo resist 276B over BARC 276A. As a result, hard mask 374 is exposed, while hard masks 174 and 274 are covered by etching masks 176 and 276, respectively. The material(s), the structure, and the formation process of etching masks 176 and 276 may be similar to the corresponding material(s), the structure, and the formation process of etching masks 165 and 365 (FIG. 10), and the details are not repeated herein.

Figure 15:
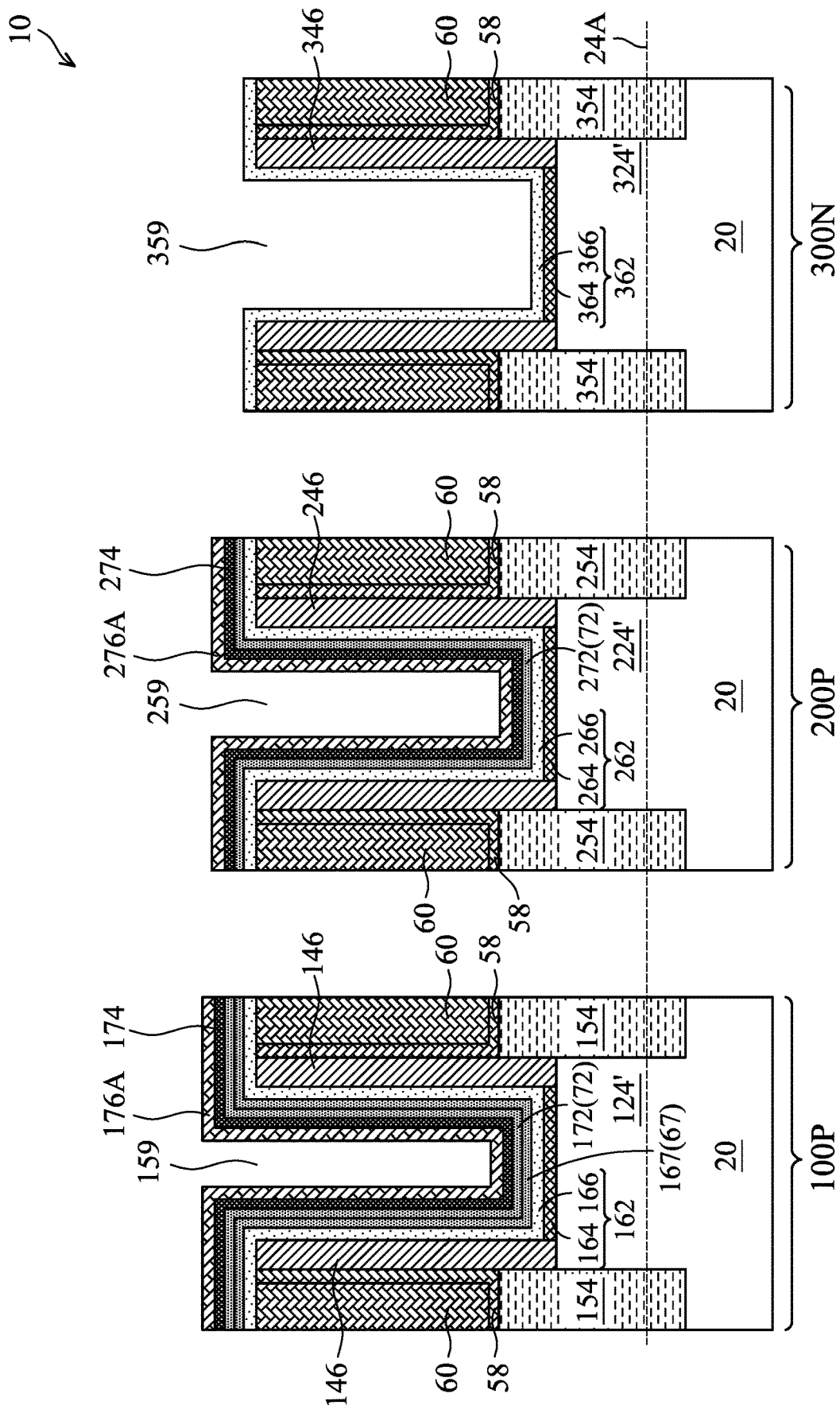

In subsequent processes, photo resists 176B and 276B may be removed. BARCs 176A and 276A are used as an etching mask to etch and remove hard mask 374 and p-type work-function layers 372 and 367. The respective process is illustrated as process 432 in the process flow 400 shown in FIG. 24. The resulting structure is shown in FIG. 15. The etching of hard mask 374 and p-type work-function layers 372 and 367 may be similar to the etching of hard mask 268 and p-type work-function layer 267 (FIG. 10), respectively, and the details are not discussed.

Figure 16:
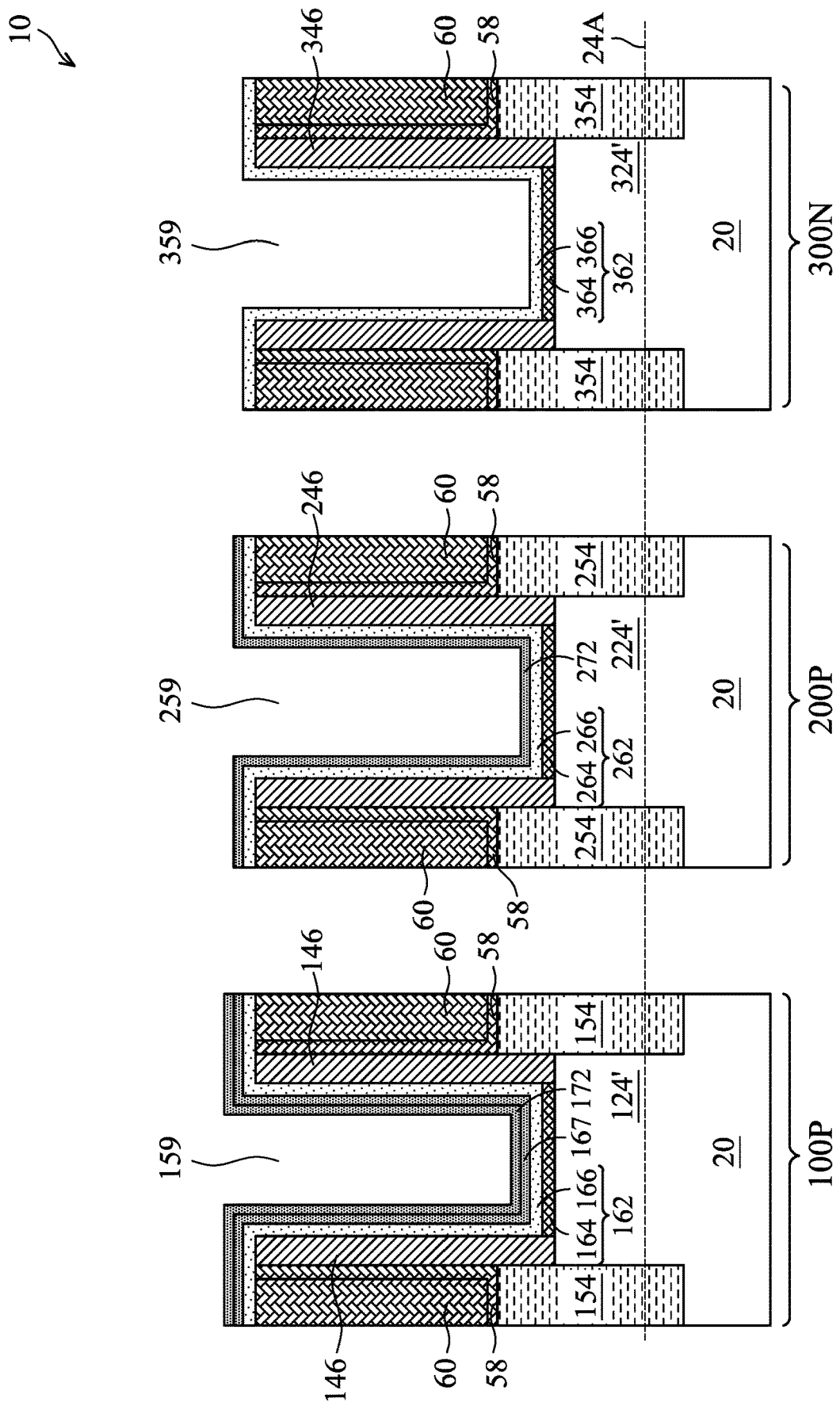

As shown in the preceding patterning processes, p-type work-function layer 367 is etched in the same process for etching p-type work-function layer 372 (FIG. 15), rather than in the same process for etching p-type work-function layer 267 (FIG. 11). This has the advantageous feature of exposing high-k dielectric layer 366 once, rather than twice, to the etching chemicals. This will reduce the loss in high-k dielectric layer 366 in the etching processes. High-k dielectric layer 366 is thus exposed, as shown in FIG. 15. Next, BARCs 176A and 276A are removed using similar methods as removing BARCs 165A and 365A (FIG. 11). Hard masks 174 and 274 are also removed, similar to the removal of hard masks 168 and 368 (FIG. 11). The respective process is illustrated as process 434 in the process flow 400 shown in FIG. 24. The resulting structure is shown in FIG. 16.

Figure 17:
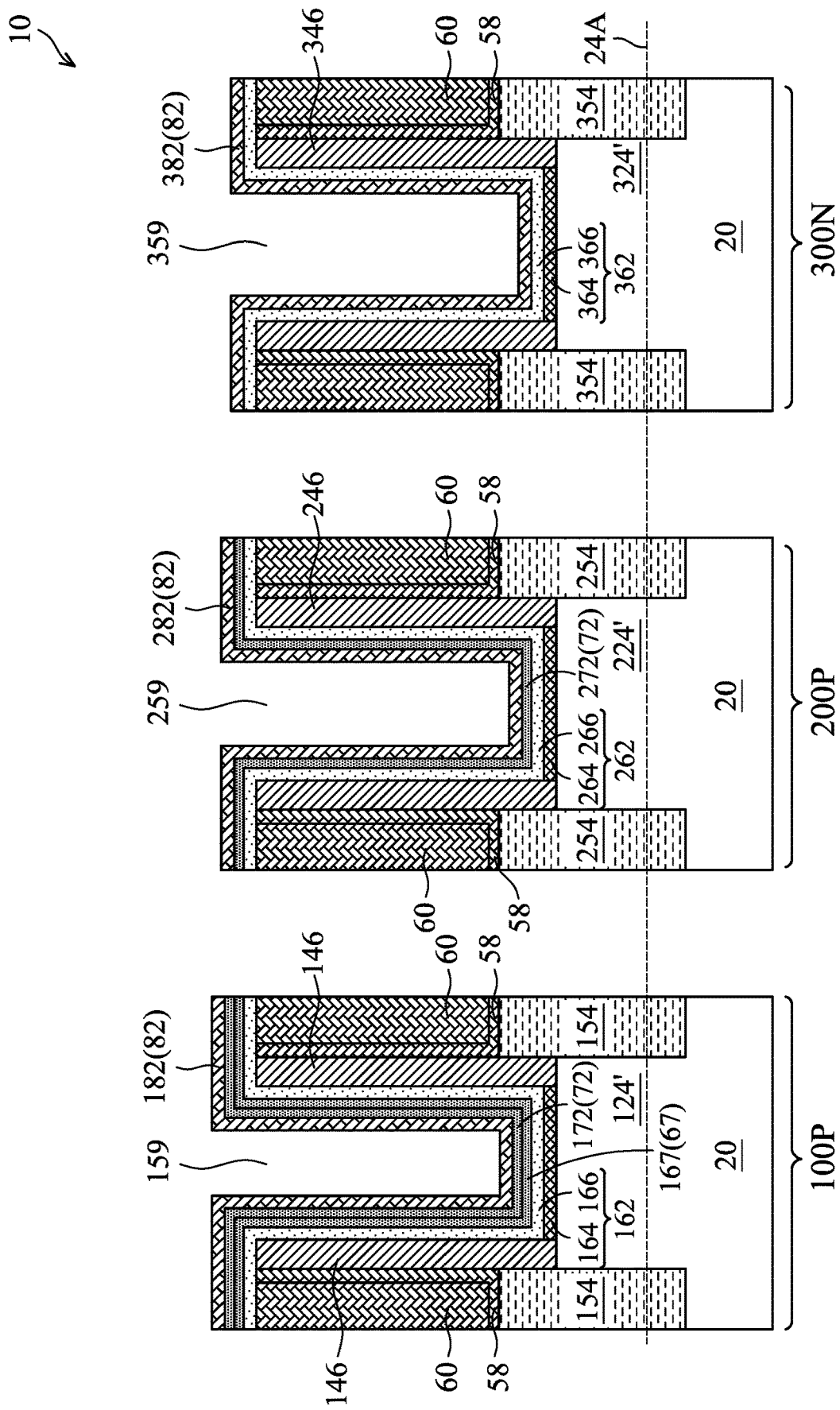

FIG. 17 illustrates the formation of n-type work-function layer 82, which includes n-type work-function layers (portions) 182, 282, and 382 in device regions 100P, 200P, and 300N, respectively. The respective process is illustrated as process 436 in the process flow 400 shown in FIG. 24. In accordance with some embodiments, work-function layer 82 may include an aluminum-based layer, which may be formed of or comprise, for example, TiAl, TiAlN, TiAlC, TaAlN, or TaAlC. Work-function layer 82 has a work function smaller than 4.5 eV.

Figure 18:
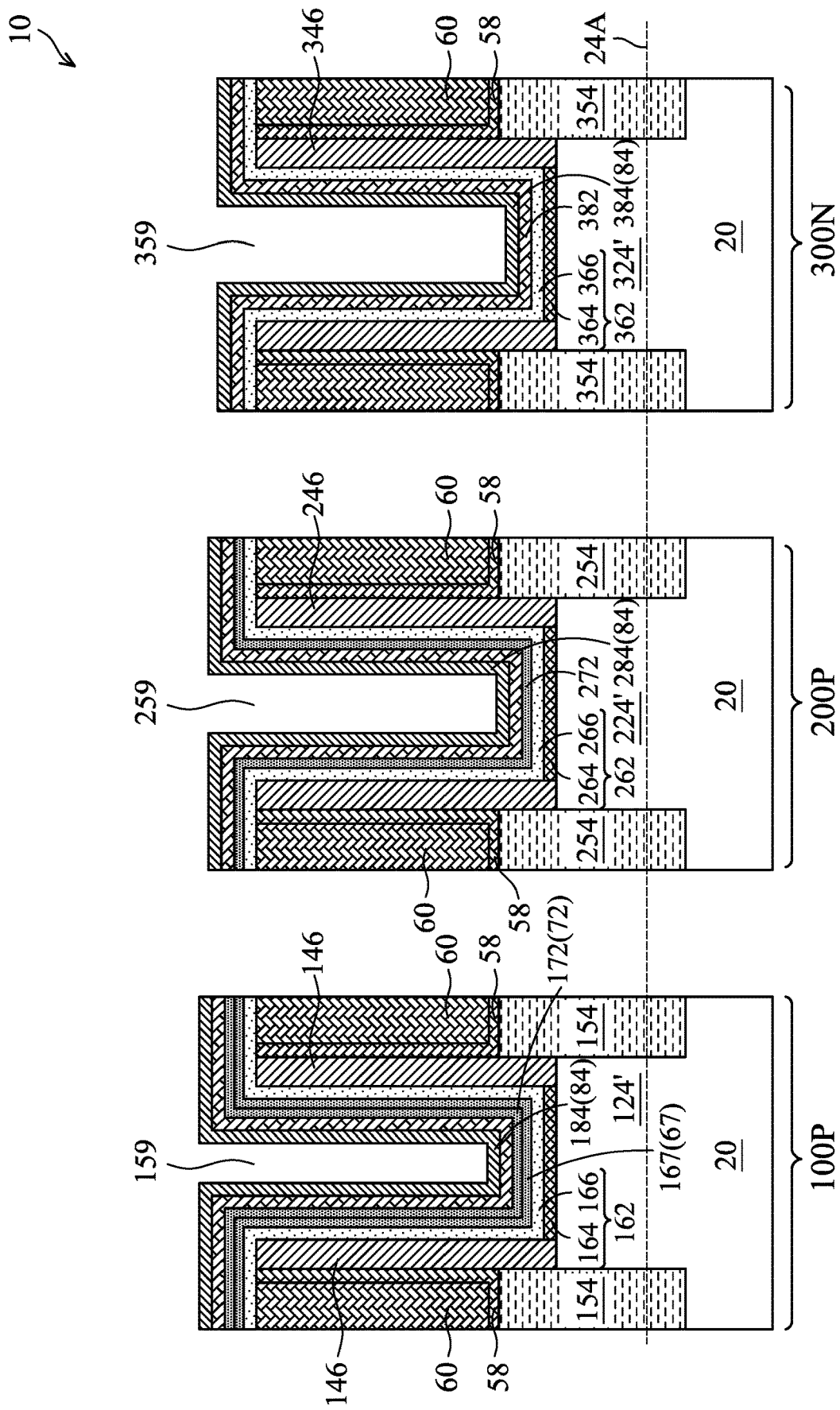
Figure 19:
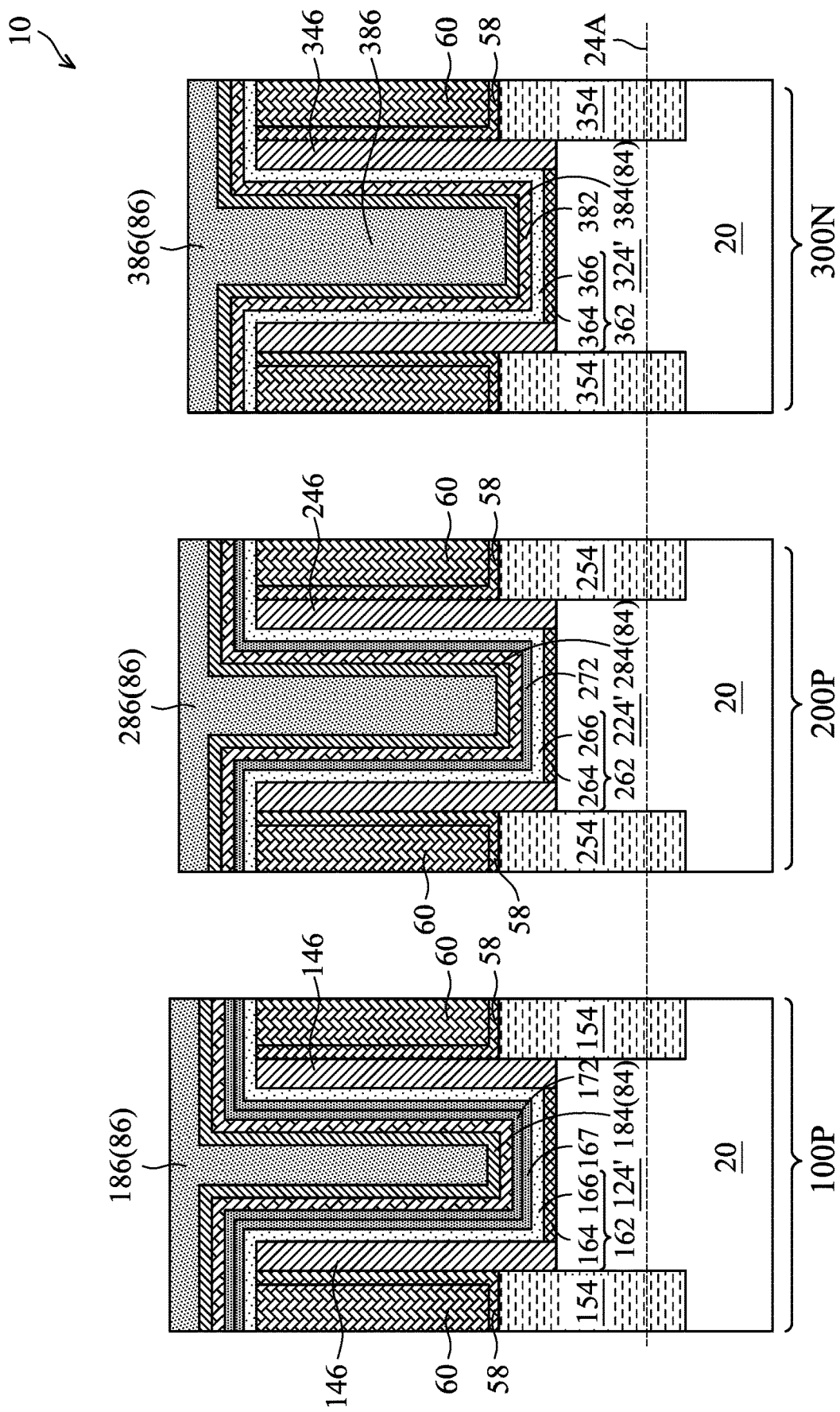

Next, in accordance with some embodiments, a plurality of metal layers are formed to fill trenches 159, 259, and 359, respectively, and the resulting structure is shown in FIGS. 18 and 19. The respective process is illustrated as process 438 in the process flow 400 shown in FIG. 24. Referring to FIG. 18, glue layer 84 (including portions 184, 284, and 384, which may be formed simultaneously) is formed as a conformal layer extending into device regions 100P, 200P, and 300N, respectively. In accordance with some embodiments, glue layers 184, 284, and 384 comprise TiN, TaN, or the like, which may be deposited using a conformal deposition method such as ALD, CVD, or the like. In accordance with some example embodiments, glue layers 184, 284, and 384 comprise TiN deposited using ALD, with $TiCl_4$ and $NH_3$ as precursors. The deposition temperature is higher than the deposition temperature of p-type work-function layer 72, for example, by a temperature difference in the range between about 50° C. and about 150° C. In accordance with some embodiments, the deposition temperature of glue layers 184, 284, and 384 is in the range between about 400° C. and about 500° C. Depositing glue layers 184, 284, and 384 at a high temperature has the advantageous feature of reducing the chlorine atomic percentage in the resulting glue layers 184, 284, and 384. For example, the chlorine atomic percentage may be lower than about 0.1 percent, or may be in the range between about 0.01 percent and about 0.1 percent. As a comparison, the chlorine atomic percentage in p-type work-function layer 272 may be higher than about 1 percent, and may be in the range between about 1 percent and about 4.5 percent.

FIG. 19 illustrates the formation of filling-metal regions 86 (including 186, 286, and 386). In accordance with some embodiments, filling-metal regions 186, 286, and 386 are formed of tungsten, cobalt, or the like, which may be deposited using ALD, CVD, or the like. In accordance alternative some embodiments, glue layers 184, 284, and 384 fully fill the corresponding trenches, and the filling-metal regions are not formed.

Figure 20:
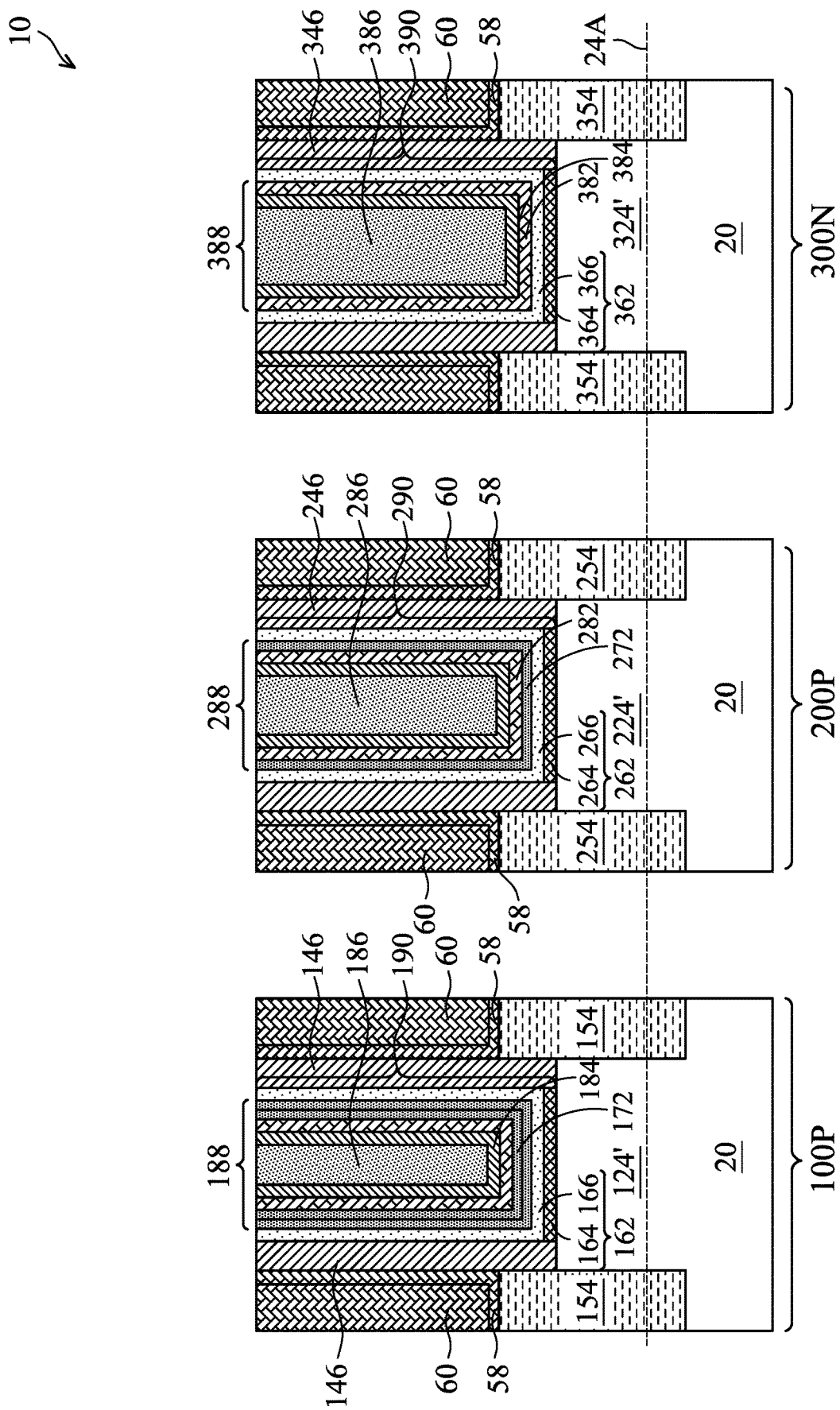

After the trenches are fully filled, a planarization process is performed to remove excess portions of the plurality of layers, resulting in the gate stacks 190, 290, and 390 as shown in FIG. 20. Gate stacks 190, 290, and 390 include gate electrodes 188, 288, and 388, respectively.

Figure 21A:
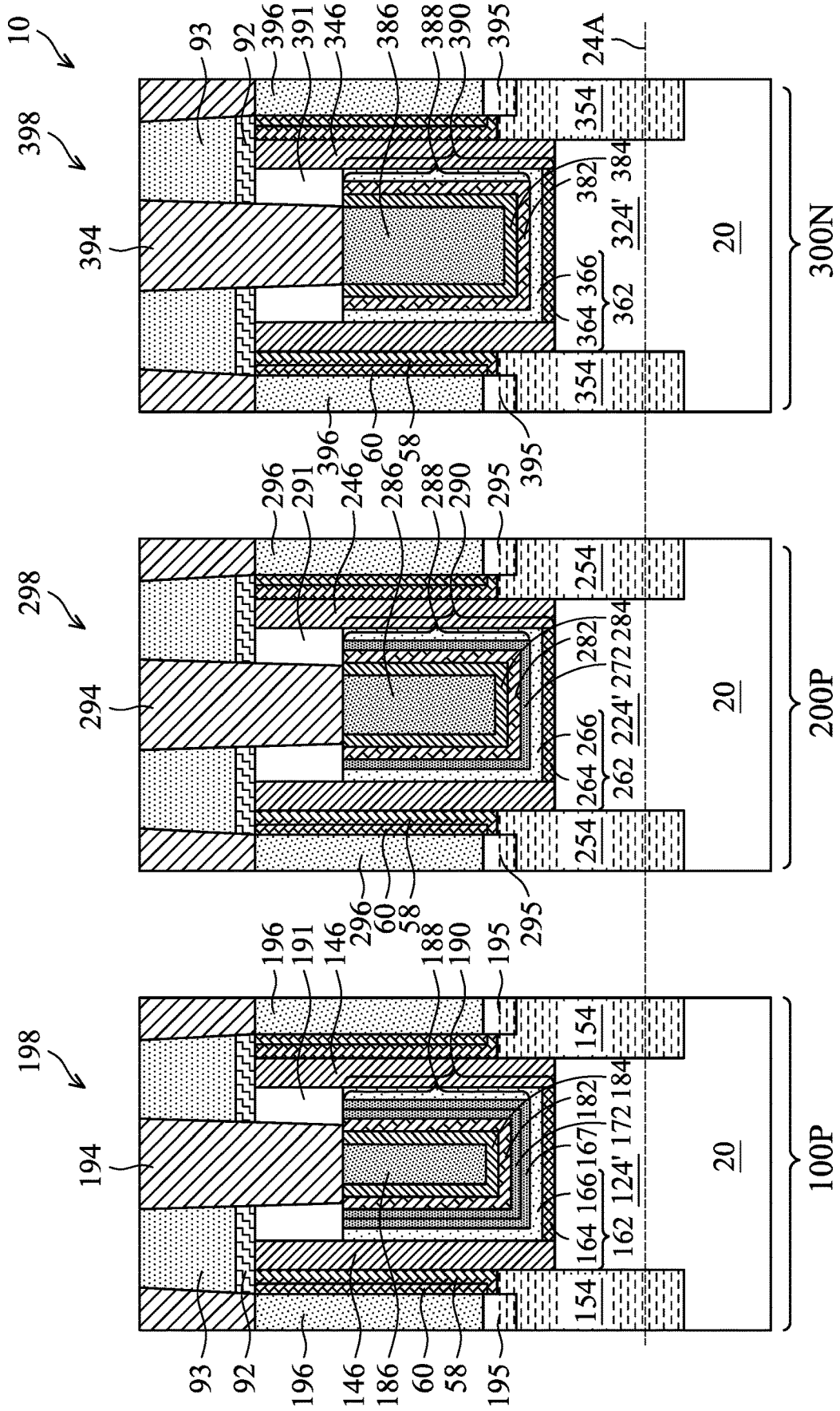

FIG. 21A illustrates the formation of self-aligned hard masks 191, 291, and 391 in accordance with some embodiments. The formation process may include performing an etching process to recess gate stacks 190, 290, and 390, so that recesses are formed between gate spacers 146, 246, and 346. The recesses are then filled with a dielectric material, followed by a planarization process to remove excess portions of the dielectric material. Hard masks 191, 291, and 391 may be formed of silicon nitride, silicon oxy-nitride, silicon oxy-carbo-nitride, or the like. In addition, source/drain contact plugs 196, 296, and 396 and silicide regions 195, 295, and 395 are formed to electrically connect to source/drain regions 154, 254, and 354, respectively. Gate contact plugs 194, 294, and 394 are formed to electrically connect to gate electrodes 188, 288, and 388, respectively. P-type FinFETs 198 and 298 and n-type FinFET 398 are thus formed in device regions 100P, 200P, and 300N, respectively.

Gate electrode 188 of FinFET 198 includes p-type work-function layer 167, p-type work-function layer 172, and n-type work-function layer 182. The work function of work-function layer 167 dominates the work function of gate electrode 188. Gate electrode 288 of FinFET 298 includes p-type work-function layer 272 and n-type work-function layer 282. The work function of work-function layer 272 dominates the work function of gate electrode 288. Gate electrode 388 of FinFET 398 includes n-type work-function layer 382. Accordingly, FinFET 198 has a first p-type work function WF1, and FinFET 298 has a second p-type work function WF2 higher than work function WF1. FinFET 398 has an n-type work function, which is smaller than both of work functions WF1 and WF2.

Figure 21B:
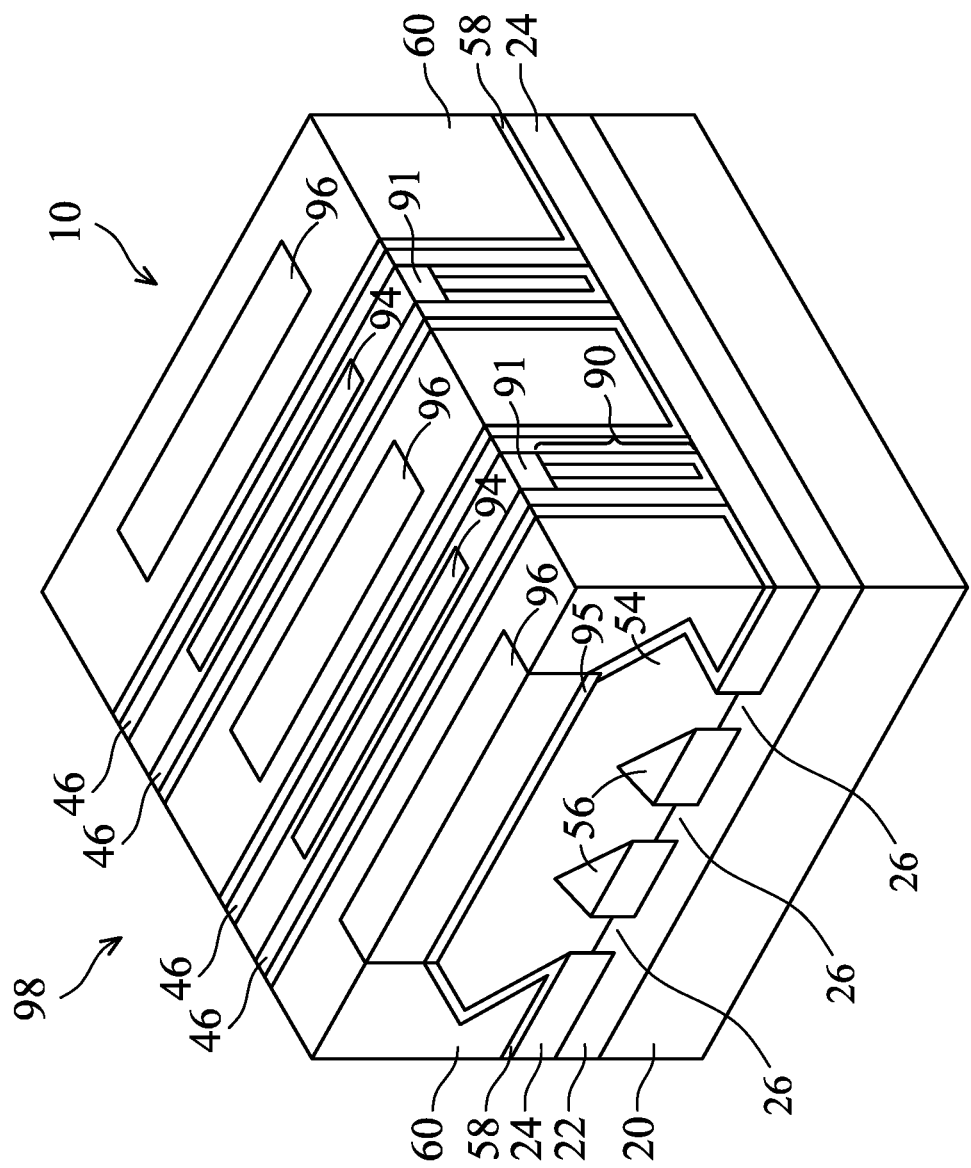

FIG. 21B illustrates a perspective view of a FinFET 98, which may represent either one of FinFETs 198, 298, and 398 as shown in FIG. 21A. Gate contact plug 94 (representing 194, 294, and 394 in FIG. 21A), source/drain silicide regions 95 (representing 195, 295, and 395), and source/drain contact plugs 96 (representing 196, 296, and 396) are also illustrated.

In above-discussed example embodiments, the p-type work-function layer 67, which has a lower work function due to its relatively higher deposition temperature, is deposited before the deposition of p-type work-function layer 72 and n-type work-function layer 82. In accordance with other embodiments, the orders of the formation of work-function layers 67, 72, and 82 may be rearranged adopting any other order.

The embodiments of the present disclosure have some advantageous features. By reducing the deposition temperature of p-type work-function layers, a higher work function may be achieved. By distinguishing the deposition temperatures of p-type work-function layers, different work functions may be achieved for different transistors, even if p-type work-function layers are formed of a same material.

In accordance with some embodiments of the present disclosure, a method includes forming isolation regions extending into a semiconductor substrate; recessing the isolation regions, wherein after the recessing, a portion of a semiconductor material between the isolation regions protrudes higher than top surfaces of the isolation regions to form a semiconductor fin; forming a first gate stack comprising: forming a first gate dielectric on sidewalls and a top surface of the semiconductor fin; and depositing a first titanium nitride layer over the first gate dielectric as a work-function layer, wherein the first titanium nitride layer is deposited at a first temperature in a first range between about 300° C. and about 400° C.; and forming a source region and a drain region, wherein the source region and the drain region are on opposing sides of the first gate stack. In an embodiment, the first titanium nitride layer is formed using atomic layer deposition, with titanium chloride (TiCl$_4$) and ammonia (NH$_3$) being used as precursors. In an embodiment, the method further includes depositing an n-type work function layer over the first titanium nitride layer; and depositing a second titanium nitride layer over the n-type work function layer, wherein the second titanium nitride layer is deposited at a second temperature higher than the first temperature. In an embodiment, the method further includes depositing a second titanium nitride layer, with the first titanium nitride layer being contacting the second titanium nitride layer, wherein the second titanium nitride layer is deposited at a second temperature higher than the first temperature. In an embodiment, the second temperature is higher than the first temperature by a temperature difference greater than about 50° C. In an embodiment, the second temperature is in a second range between about 400° C. and about 500° C. In an embodiment, the source region and the drain region are formed as p-type regions.

In accordance with some embodiments of the present disclosure, a device includes a first transistor and a second transistor. The first transistor includes a first semiconductor region; a first high-k dielectric over the first semiconductor region; and a first work-function layer over and contacting the first high-k dielectric, wherein the first work-function layer has a first work function. The second transistor includes a second semiconductor region; a second high-k dielectric over and contacting the second semiconductor region; and a second work-function layer over and contacting the second high-k dielectric, wherein the first work-function layer and the second work-function layer are formed of a same material, and wherein the second work-function layer has a second work function higher than the first work function. In an embodiment, the first transistor and the second transistor are p-type transistors, and the second work function is greater than the first work function by more than about 20 mV. In an embodiment, the first transistor and the second transistor are p-type transistors, and the first work-function layer and the second work-function layer comprise titanium nitride. In an embodiment, the device further includes a third work-function layer over and contacting the first work-function layer, wherein the third work-function layer and the second work-function layer are formed of the same material, and wherein the third work-function layer has the second work function. In an embodiment, the first work-function layer has a first (200)/(111) signal intensity ratio greater than about 1.5. In an embodiment, the second work-function layer has a second (200)/(111) signal intensity ratio smaller than the first (200)/(111) signal intensity ratio. In an embodiment, the device further includes a glue layer in the second transistor and over the second work-function layer, wherein the glue layer and the second work-function layer are formed of a same material, and wherein the glue layer has a third (200)/(111) signal intensity ratio equal to the second (200)/(111) signal intensity ratio.

In accordance with some embodiments of the present disclosure, a device includes a first semiconductor region; a first gate stack on the first semiconductor region, the first gate stack comprising: a first gate dielectric; and a first titanium nitride layer over and contacting the first gate dielectric, wherein the first titanium nitride layer has a first (200)/(111) signal intensity ratio greater than about 1.5; and a first p-type source region and a first p-type drain region on opposing sides of the first gate stack. In an embodiment, the device further includes a second titanium nitride layer over the first titanium nitride layer, wherein the second titanium nitride layer has a second (200)/(111) signal intensity ratio different from the first (200)/(111) signal intensity ratio. In an embodiment, the second (200)/(111) signal intensity ratio is smaller than the first (200)/(111) signal intensity ratio. In an embodiment, the device further includes an n-type work function layer between the first titanium nitride layer and the second titanium nitride layer. In an embodiment, the first titanium nitride layer is in physical contact with the second titanium nitride layer. In an embodiment, the device further includes a second semiconductor region; and a second gate stack on the second semiconductor region, the second gate stack comprising: a second gate dielectric; and a second titanium nitride layer over and contacting the second gate dielectric, wherein the second titanium nitride layer has a second (200)/(111) signal intensity ratio smaller than the first (200)/(111) signal intensity ratio; and a second p-type source region and a second p-type drain region on opposing sides of the second gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming isolation regions extending into a semiconductor substrate;
   recessing the isolation regions, wherein after the recessing, a portion of a semiconductor material between the isolation regions protrudes higher than top surfaces of the isolation regions to form a semiconductor fin;
   forming a first gate stack comprising:
      forming a first gate dielectric on sidewalls and a top surface of the semiconductor fin;
      depositing a first titanium nitride layer over the first gate dielectric as a work-function layer, wherein the first titanium nitride layer is deposited at a first temperature in a first range between about 300° C. and about 400° C.;
      depositing an n-type work function layer over the first titanium nitride layer; and
      depositing a second titanium nitride layer over the n-type work function layer, wherein the second titanium nitride layer is deposited at a second temperature higher than the first temperature; and
   forming a source region and a drain region, wherein the source region and the drain region are on opposing sides of the first gate stack.

2. The method of claim 1, wherein the first titanium nitride layer is formed using atomic layer deposition, with titanium chloride (TiCl$_4$) and ammonia (NH$_3$) being used as precursors.

3. The method of claim 1, wherein the second temperature is higher than the first temperature by a temperature difference greater than about 50° C.

4. The method of claim 1, wherein the second temperature is in a second range between about 400° C. and about 500° C.

5. The method of claim 1, wherein the source region and the drain region are formed as p-type regions.

6. The method of claim 1, wherein the n-type work function layer comprises aluminum.

7. The method of claim 1, wherein the n-type work function layer has a work function smaller than 4.5 eV.

8. A method comprising:
   forming a first semiconductor region and a second semiconductor region on a semiconductor substrate;
   forming a first transistor comprising:
      depositing a first high-k dielectric over the first semiconductor region; and
      depositing a first work-function layer over the first high-k dielectric, wherein the first work-function layer is deposited at a first temperature; and
   forming a second transistor comprising:
      depositing a second high-k dielectric over the second semiconductor region; and
      depositing a second work-function layer over the second high-k dielectric, wherein the first work-function layer and the second work-function layer are formed of a same material, and wherein the second work-function layer is deposited at a second temperature lower than the first temperature.

9. The method of claim 8, wherein the second temperature is in a range between about 300° C. and about 400° C.

10. The method of claim 9, wherein the first temperature is in a range between about 400° C. and about 500° C.

11. The method of claim 8, wherein the first work-function layer has a first work function, and wherein the second work-function layer has a second work function higher than the first work function.

12. The method of claim 11, wherein both of the first transistor and the second transistor are formed as p-type transistors, and the second work function is greater than the first work function by more than about 20 mV.

13. The method of claim 8, wherein both of the depositing the first work-function layer and the depositing the second work-function layer comprise depositing titanium nitride.

14. The method of claim 8, wherein when the second work-function layer is deposited for the second transistor, an extension portion of the second work-function layer is deposited as a part of the first transistor, and the extension portion is over the first work-function layer.

15. The method of claim 14, wherein the extension portion is in physical contact with the first work-function layer.

16. A method comprising:
   forming a gate stack on a semiconductor region, the forming the gate stack comprising:
      depositing a gate dielectric; and
      depositing a first titanium nitride layer over the gate dielectric, wherein the first titanium nitride layer is deposited at a first temperature; and
      depositing a second titanium nitride layer over the first titanium nitride layer, wherein the second titanium nitride layer is deposited at a second temperature higher than the first temperature.

17. The method of claim 16, wherein the first titanium nitride layer contacts the gate dielectric.

18. The method of claim 16, wherein the first temperature is in a range between about 300° C. and about 400° C.

19. The method of claim 16, wherein the second temperature is higher than the first temperature by a difference greater than about 50° C.

20. The method of claim 16, wherein the second titanium nitride layer physically contacts the first titanium nitride layer.

* * * * *